(12) United States Patent
Kojima

(10) Patent No.: US 6,510,542 B1
(45) Date of Patent: Jan. 21, 2003

(54) METHOD OF PLACING A REPEATER CELL IN AN ELECTRICALCIRCUIT

(75) Inventor: Naohito Kojima, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/416,200

(22) Filed: Oct. 8, 1999

Related U.S. Application Data

(63) Continuation-in-part of application No. 09/169,283, filed on Oct. 8, 1998, now abandoned.

(51) Int. Cl.$^7$ ............................................... G06F 17/50
(52) U.S. Cl. ................................ 716/10; 716/5; 716/12; 716/2
(58) Field of Search ....................................... 716/1–21

(56) References Cited

U.S. PATENT DOCUMENTS

| | | | |
|---|---|---|---|
| 5,067,091 A | * 11/1991 | Nakazawa | 716/3 |
| 5,410,491 A | * 4/1995 | Minami | 716/6 |
| 5,638,291 A | * 6/1997 | Li et al. | 716/18 |
| 5,838,581 A | * 11/1998 | Kuroda | 716/8 |
| 5,912,820 A | * 6/1999 | Kerzman et al. | 716/6 |
| 6,009,248 A | * 12/1999 | Sato et al. | 716/2 |
| 6,148,432 A | * 11/2000 | Brown | 716/1 |
| 6,198,978 B1 | * 3/2001 | Takahashi | 700/97 |
| 6,230,302 B1 | * 5/2001 | Gabele et al. | 716/6 |
| 6,308,310 B1 | * 10/2001 | Nakamura | 716/14 |
| 6,341,365 B1 | * 1/2002 | Dwyer et al. | 716/8 |
| 6,347,393 B1 | * 2/2002 | Alpert et al. | 716/2 |
| 6,389,581 B1 | * 5/2002 | Muddu et al. | 716/6 |
| 6,397,169 B1 | * 5/2002 | Shenoy et al. | 703/14 |
| 6,412,101 B1 | * 6/2002 | Chang et al. | 716/10 |

OTHER PUBLICATIONS

Chen et al. ("An Algorithm for Zero–Skew Clock Tree Routing with Buffer Insertion", Proceedings of European Design and Test Conference, 1996, ED& TC 96, Mar. 11, 1996, pp. 230–236).*

Tellez et al. ("Minimal buffer insertion in clock trees with skew and slew rate constraints", IEEE Transactions on Computer–Aided Design of Integrated Circuits and Systems, vol. 16, No. 4, Apr. 1997, pp. 333–342).*

Kim et al. ("An automatic clock tree design system for high–speed VLSI designs: planar clock routing with the treatment of obstacles", Proceedings of the 1999 IEEE International Symposium of Circuits and Systems, vol. 6, May 30, 1999, pp. 258–261).*

Zhu et al. ("Planar clock routing for high performance chip and package co–design", IEEE Transactions on Very Large Scale Integration (VLSI) Systems, vol. 4, No. 2, Jun. 1996, pp. 210–226).*

* cited by examiner

*Primary Examiner*—Matthew Smith
*Assistant Examiner*—Phallaka Kik
(74) *Attorney, Agent, or Firm*—Gray Cary Ware & Freidenrich LLP

(57) ABSTRACT

A repeater insertion method is described which allows for repeater cell insertion into two or more fanout nets. Repeater cell location is determined such that at any given point, the interval capacitance between any two repeater cell nodes is no greater than a predetermined amount. Furthermore, the method allows for successful "back-annotation" into synthesis or layout software without the need to add new input/output pins to the module definition. Additionally, the method allows for repeater cell insertion using two or more sizes of repeater cells. Finally, the method described considers the "slack" of each fanout, and makes the signal delay from the source to the most critical fanout shorter than the result of usual repeater insertion methods.

37 Claims, 30 Drawing Sheets

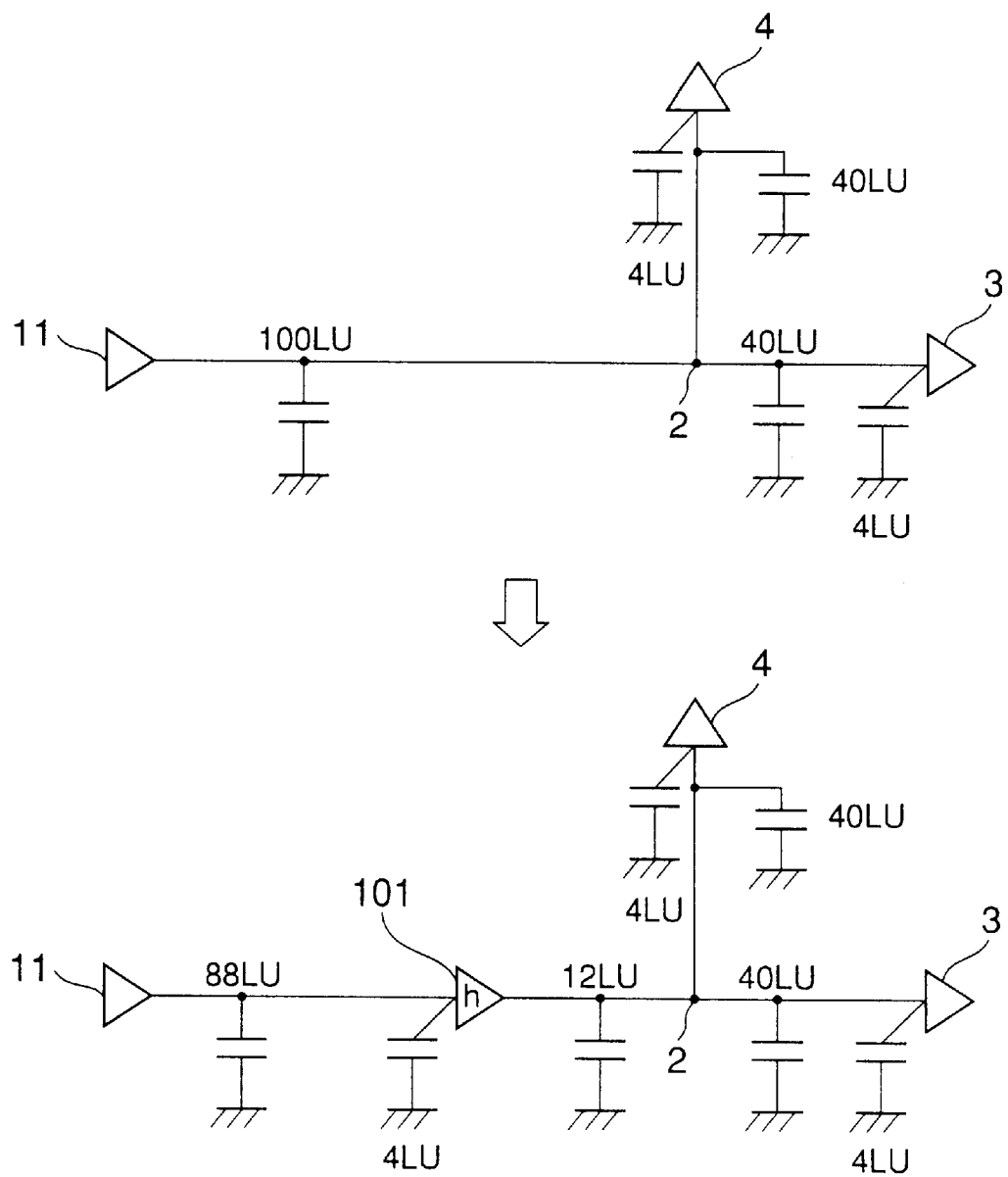
F I G. 5A

DIRECTED GRAPH OF THE NET

"INSERT OK" FLAG

DIRECTED GRAPH OF THE NET

"INSERT OK" FLAG

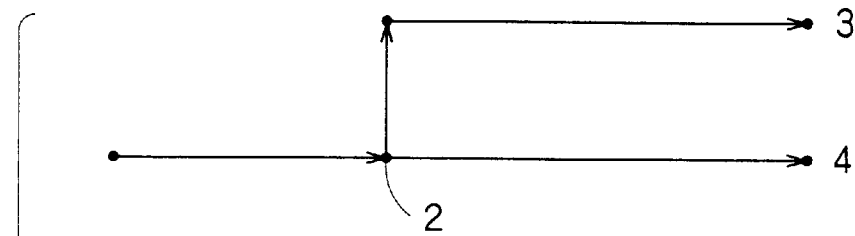
DIRECTED GRAPH OF THE NET
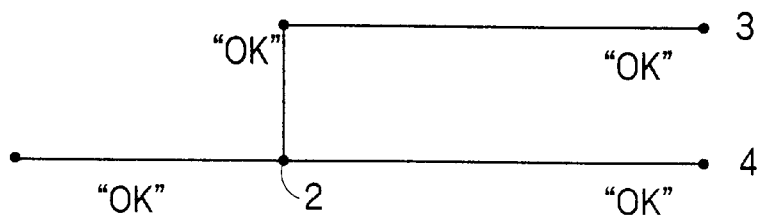
"INSERT OK" FLAG
"INSERT OK" FLAG DOES NOT CHANGE $\begin{cases} \text{"OK"} \to \text{"notOK"} \\ \text{"notOK"} \to \text{"OK"} \end{cases}$
DURING THE REPEATER INSERTION OPERATION
F I G. 7B

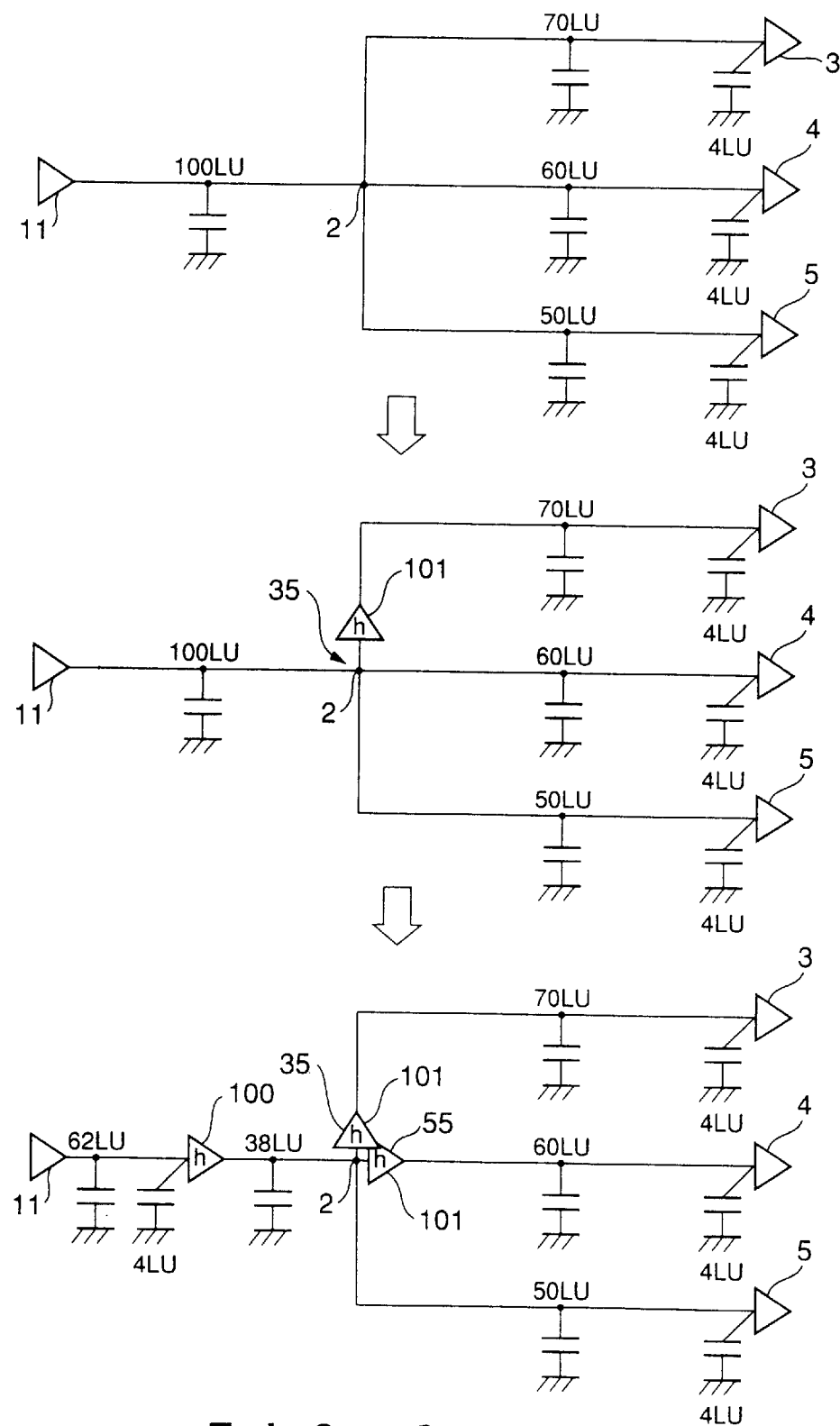
F I G. 8A

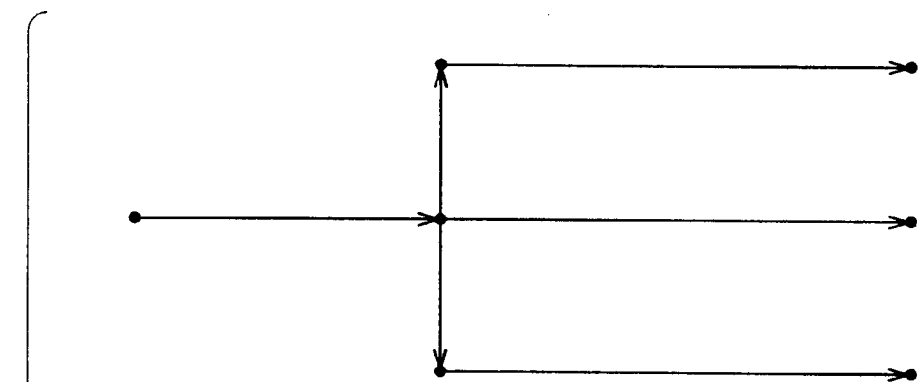
DIRECTED GRAPH OF THE NET
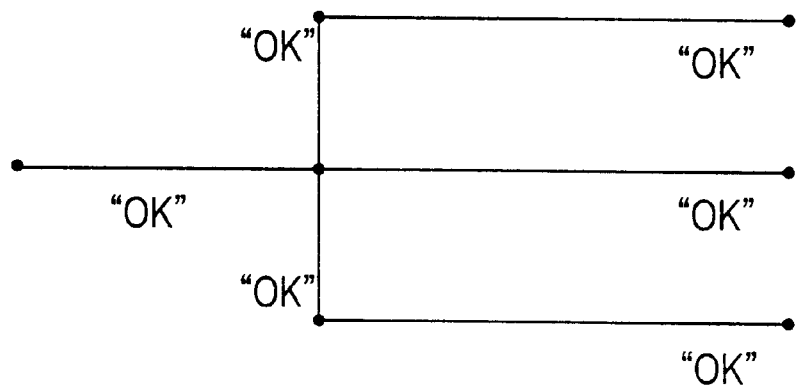
"INSERT OK" FLAG
F I G. 8B

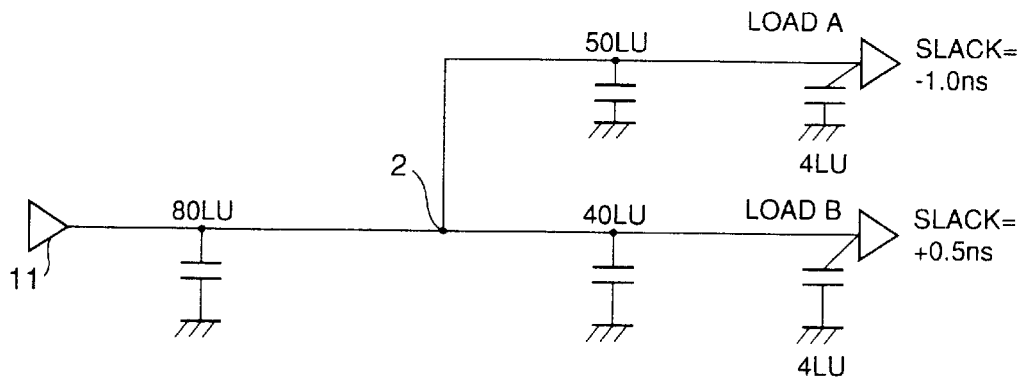
F I G. 12A
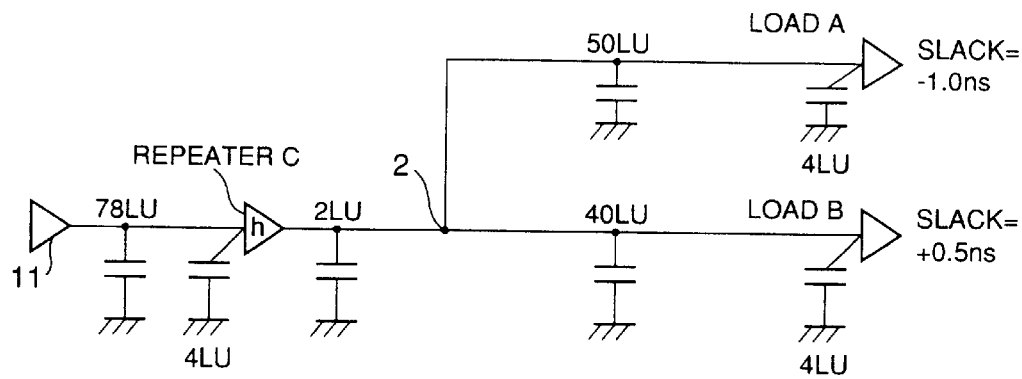
F I G. 12B
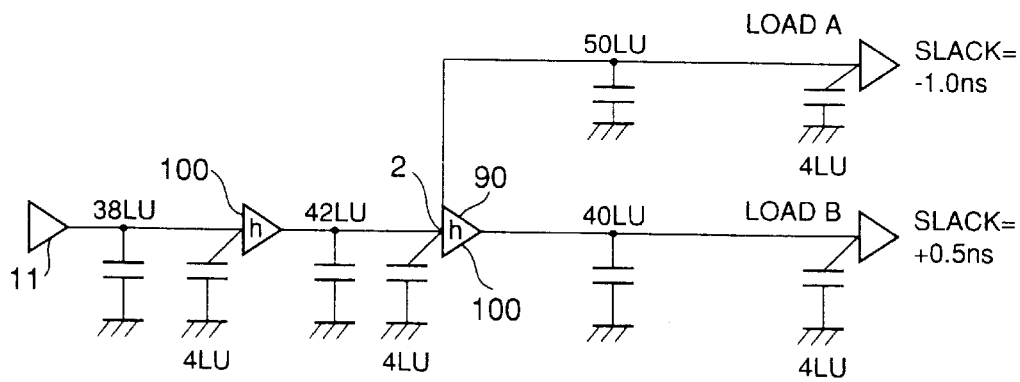
F I G. 12C

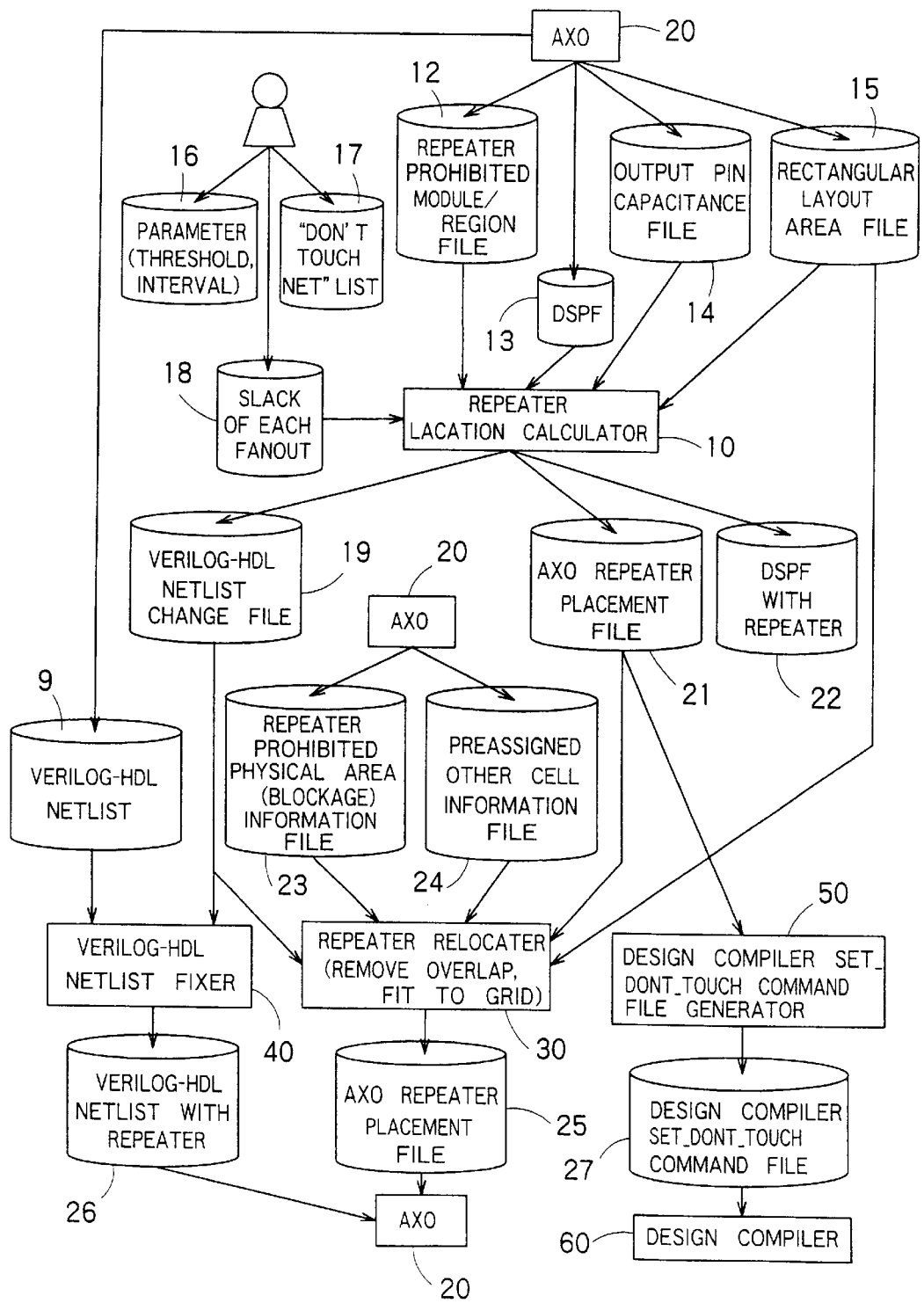
F I G. 13

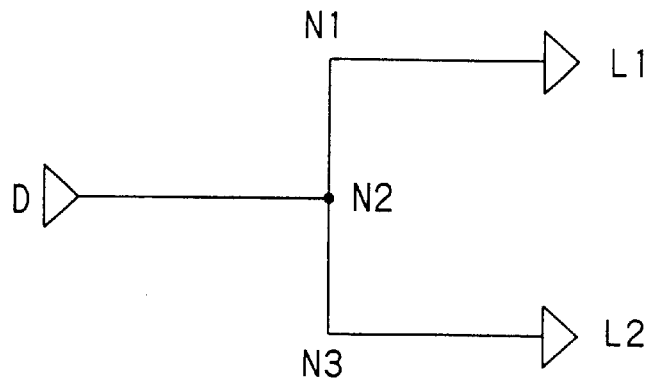
F I G. 27A
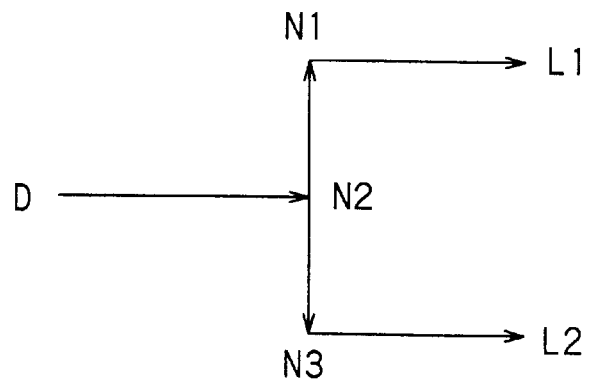
F I G. 27B
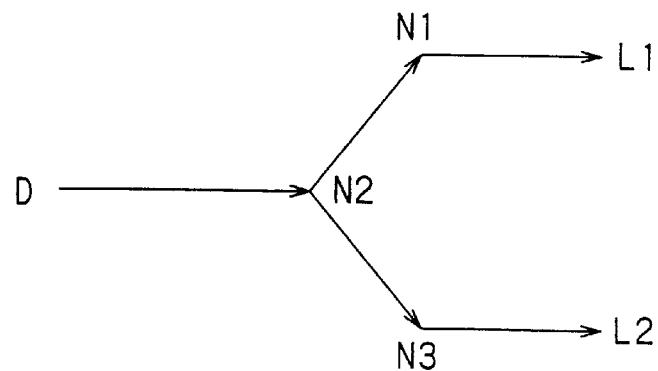
F I G. 27C

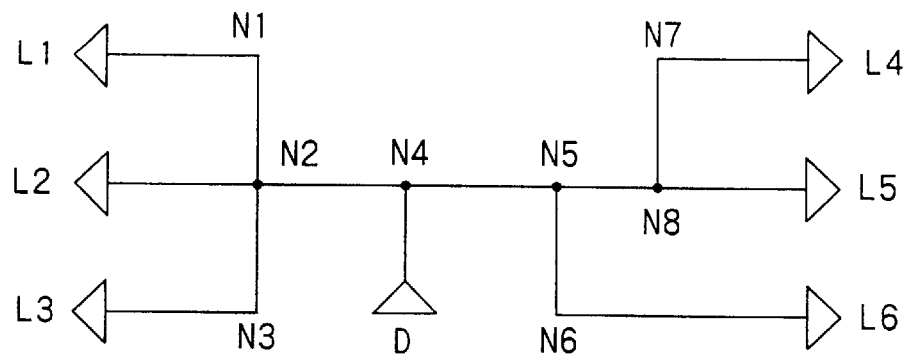
F I G. 28A
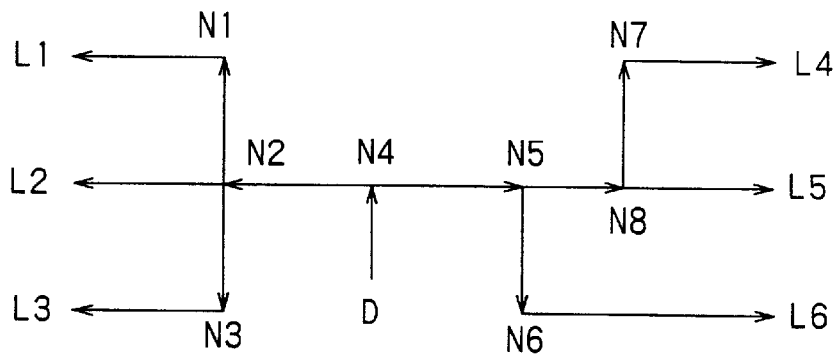
F I G. 28B
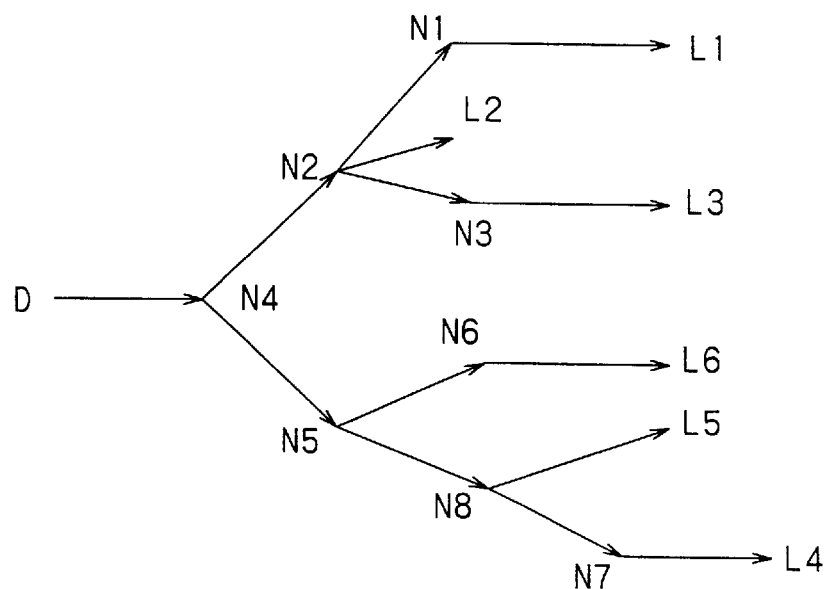
F I G. 28C

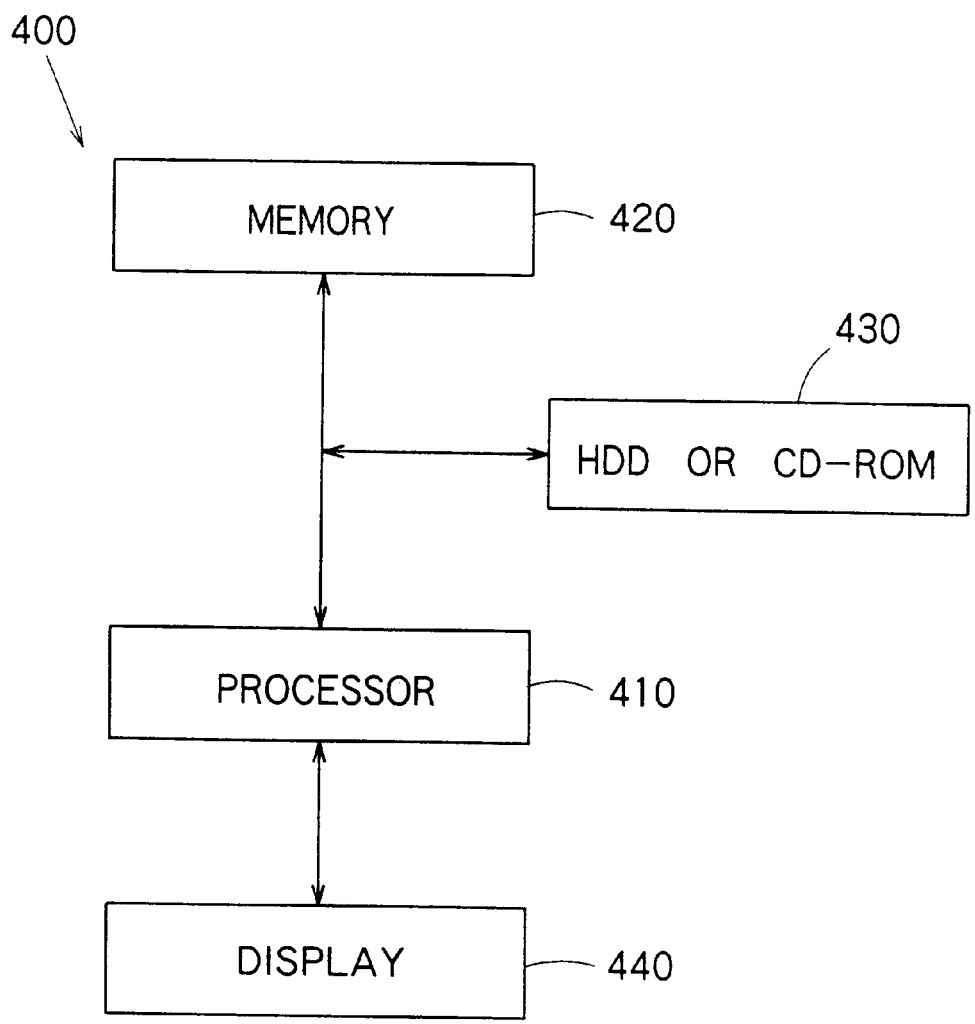
F I G. 29

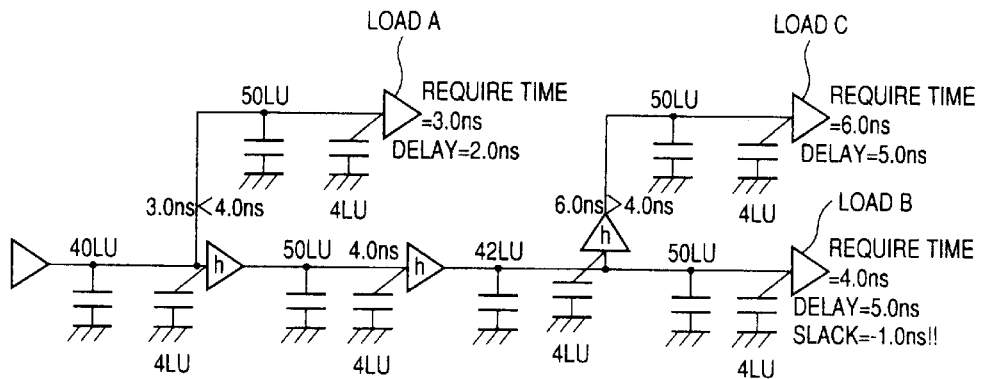
F I G. 30
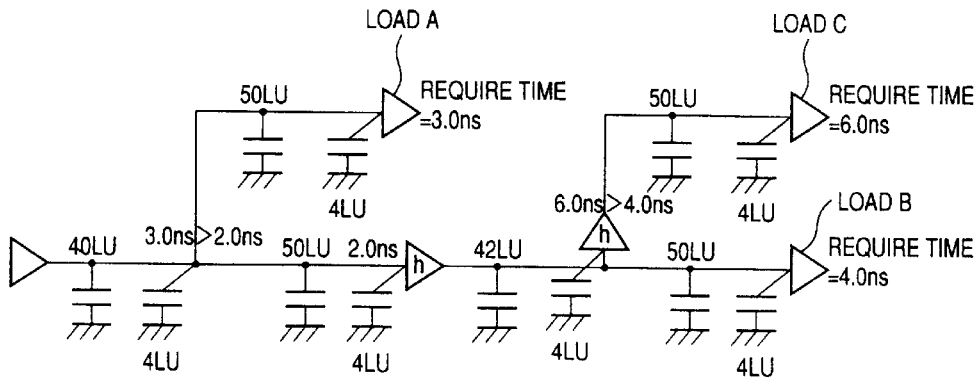
F I G. 31A
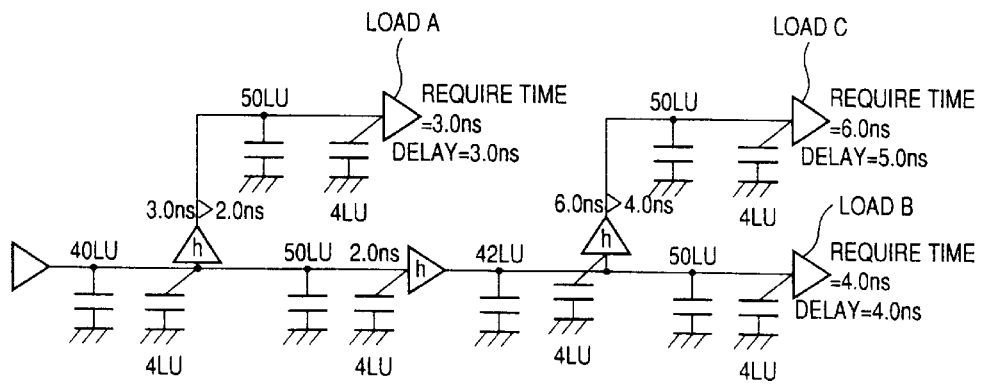
F I G. 31B

METHOD OF PLACING A REPEATER CELL IN AN ELECTRICAL CIRCUIT

This is a continuation-in-part of Application Ser. No. 09/169,283, filed Oct. 8, 1998, now abandoned.

TECHNICAL FIELD

This invention relates to a method for repeater insertion in electrical circuitry at the micro-circuitry level.

BACKGROUND ART

In today's design of VLSI high speed circuits, frequency has a major impact on the number of repeater cells that need to be inserted. A microprocessor operating at less than 200 MHz might require several hundred repeater cells, whereas one operating at greater than 500 MHz may require a number in the thousands.

In a high performance VLSI design, signal propagation over on-chip metal interconnect is significant due to RC delay. In general, the interconnect delay increases with the square of the length of the line. Delay can be reduced by inserting a repeater cell such as an inverting or non-inverting buffer.

Prior art methods of repeater insertion determined buffer placement based on maintaining equal transition time for all gate input signals across the net. A maximum allowable transition time would be determined and correlated with the interconnect Elmore Delay. Such methods are described in Julian Culetu, et. al, "A Practical Repeater Insertion Method, in High-speed VLSI Circuits", proc. 35th DAC, 1998, and herein incorporated by reference.

The Elmore Delay is an efficient representation of the delay of an RC tree. A first order approximation of RC delay at any node i on an RC tree is given by the Elmore time constant $$T_i = \sum_{k=1}^{n} R_{ki} C_k$$

where Rki is the resistance of the portion of the path between the input and node i, that is common with the path between the input and node k, and Ck is the capacitance at node k.

The first order approximation of the waveform at node i is where Ti is the time constant Elmore Delay. The time at which the voltage at node i reaches any value Vx is determined by $$V_i = V_{DD}\left(1 - e^{\frac{t}{T_i}}\right)$$

With the above theory in mind, prior art insertion methods utilized a repeater insertion algorithm in order to determine proper location for repeater cells. According to one such algorithm, once the distributed capacitance has been calculated, the Elmore Delay to each of the loads in the net is calculated. The repeater cells are inserted starting from the load with the highest Elmore Delay towards the driver, i.e. "bottom-up" search. While parsing through the RC net segment by segment, Elmore Delay is calculated considering a repeater cell as a driver of the segment. If the delay exceeds a maximum, a repeater cell is inserted into the segment forming a new subnet. The process starts again from the highest Elmore Delay load.

In the case of branching, the assumed branching node is moved from an assumed repeater cell input to a repeater cell output. This continues until the maximum delay is exceeded, in which case a repeater cell is inserted with its output at the branching node. The process continues until all segments in the net have been explored.

Another prior art algorithm technique for predicting repeater cell insertion location is described in John Lillis, et. al, "Timing Optimization for Multi-source Nets: Characterization and Optimal Repeater Insertion", proc. 34th DAC, 1997, and herein incorporated by reference.

Prior art repeater insertion methods have been inadequate to achieve certain capacitance limitations between successive nodes. Significantly, they fail to produce satisfactory results in nets characterized by two or more fanout nets.

Furthermore, the prior art does not allow for "back-annotation" of the synthesis or layout software, thereby requiring additional input/output/biput pins to module definition. For example, each circuit module is characterized by a certain software module netlist. Generally, the ideal location for a repeater insert falls inside a module point. Insertion of a repeater cell at such point results in an additional input/output parameter for that module, which cannot be adequately represented in the netlist, i.e. the repeater cannot be "back-annotated" into the netlist software. As a result, the netlist for the module with the repeater cell must be regenerated.

Other repeater insertion methods were used for inter-hard macro block repeater insertion only. However, such methods cannot be used for Standard Cell circuits because new input/output pins are added to module definition after repeater insertion without module/region considering and thus do not allow for "back-annotation" of the synthesis or layout software.

Additional inadequacies in the prior art repeater insertion methods include lack of support for two or more sizes of repeater cells and are thereby restrained from handling various sized loads without significant time delay.

Finally, the prior art methods lack simple timing-driven-like repeater insertion techniques that reduce signal delay and eliminate the need for timing analysis.

In view of the above, it would be desirable to maintain minimal levels of interconnect delay and logic delay within a net.

Furthermore, it would be desirable to obtain proper repeater insertion that allows for the module to remain adequately represented by the netlist, without the need to regenerate the netlist, i.e. successful "back-annotation" into the software.

Finally, it would be desirable to allow for varying sizes of repeater cells to enable the handling of greater sized loads without significant interconnect delay and logic delay. Also, there is a need for simple timing-driven-like repeater techniques that reduce signal delay and eliminate the need for timing analysis.

SUMMARY OF THE INVENTION

Accordingly, one object of this invention is a method of inserting repeater cells, e.g. an inverter gate, into the two or more fanout nets, starting from one of the loads towards the driver, so that at any given point in the net, the interval of capacitance between any two nodes is no greater than a predetermined number of load units.

Another object of this invention is the ability to "back-annotate" to synthesis or layout software, repeater cell location, without the need for additional input/output pins to the module definition.

Yet another object of this invention is to allow for repeater insertion using two or more sizes of repeater calls.

A further object of this invention is to maintain short signal delay in the most critical fanout branches and eliminate the need for a timing analyzer while maintaining faster processing speed.

It is an advantage of this invention to maintain capacitance ratios between nodes for varying fanout circuit sizes.

It is another advantage of this invention to provide a more realistic analysis of net function in synthesis or layout software.

It is yet another advantage of this invention to reduce signal delay in nets with large loads.

Still other objects and advantages of the present invention will become readily apparent to those skilled in this art from the following detailed description, wherein only the preferred embodiment of the invention is shown and described, simply by way of illustration of the best mode contemplated in carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 5A is a simplified circuit net diagram showing the result of using the new repeater insertion method for a two-fanout net.

FIG. 7B is a representation of the result of the two-fanout net of FIG. 7A after the Set "InsertOK" Flag Below Node and Count Driving Points Below Node operation has been performed.

FIG. 8A is a simplified circuit net diagram showing the result of using the new repeater insertion method for a three-fanout net with a branch cut.

FIG. 8B is a representation of the result of the three-fanout net of FIG. 8A after the Set "InsertOK" Flag Below Node and Count Driving Points Below Node operation has been performed.

FIG. 12A is a simple circuit net diagram showing the circuit net before undergoing the new repeater insertion method with simple slack management for handling critical loads.

FIG. 12B is a simple circuit net diagram showing the result of using the new repeater insertion method without the simple slack management for handling critical loads.

FIG. 12C is a simple circuit net diagram showing the result of using the new repeater insertion method with simple slack management for handling critical loads.

FIG. 13 is flow chart of the repeater insertion data flow.

FIG. 27A is a simple circuit net diagram utilized to illustrate the result of the Build Directed Graph operation.

FIG. 27B is another representation of the circuit net diagram of FIG. 27A utilized to illustrate the result of the Build Directed Graph operation.

FIG. 27C is a circuit net diagram representation showing the result of the Build Directed Graph operation.

FIG. 28A is another circuit net diagram utilized to illustrate the result of the Build Directed Graph operation.

FIG. 28B is another representation of the circuit net diagram of FIG. 28A utilized to illustrate the result of the Build Directed Graph operation.

FIG. 28C is a circuit net diagram representation showing the result of the Build Directed Graph operation.

FIG. 29 is a representation of the system for using the computer readable program code of the present invention.

FIG. 30 is a diagram showing an example that inserts repeater cells without taking into consideration a delay of the repeater cells themselves.

FIGS. 31A and 31B is a diagram showing the second embodiment.

BEST MODE FOR PRACTICING THE INVENTION (First Embodiment)

For the purposes of this best mode, "LU" is used for the unit of load, and has a typical value of between 0.01–0.05 pF. An "H-buffer" repeater cell is an ordinary repeater cell that drives at most 100LU and has a gate capacitance of 4LU, one example of such a repeater cell is a simple inverter gate. Similarly, an "U-buffer" repeater cell Is a large repeater cell that is used for loads in excess of 100LU and has a gate capacitance of 8LU, one example of such a repeater cell is a large inverter gate. Such repeater cells are represented in the Figures as buffers, but are not limited to the buffer cells repeated herein. Any type of repeater cell used in the art is possible and contemplated by the invention.

Furthermore, all nets are considered to have a threshold load of 177LU. Therefore, all nets with equal or greater than threshold level, i.e. 177LU, are subject to repeater insertion. Each repeater cell is inserted so that it may drive at most interval capacitance of 100LU, i.e. the interval of capacitance between any two repeater cells should be no greater than 100LU.

Figure 1:
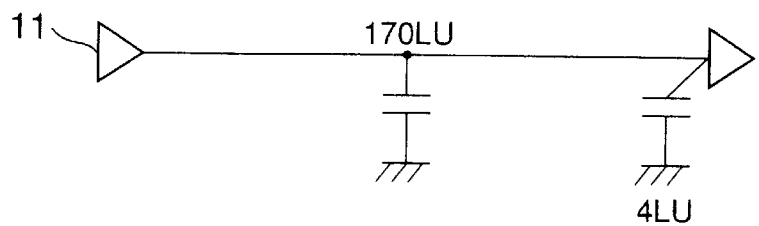
FIG. 1 is a simplified circuit net diagram depicting the result of using the repeater insertion method of the prior art.

For the purposes of more fully understanding the present invention, the prior art repeater insertion method will be described. Referring to FIG. 1, the driver 11 drives a 174LU load (170LU+4LU). Since the load (174LU) is less than the threshold, which is 177LU, no repeater cell will be inserted.

Figure 2:
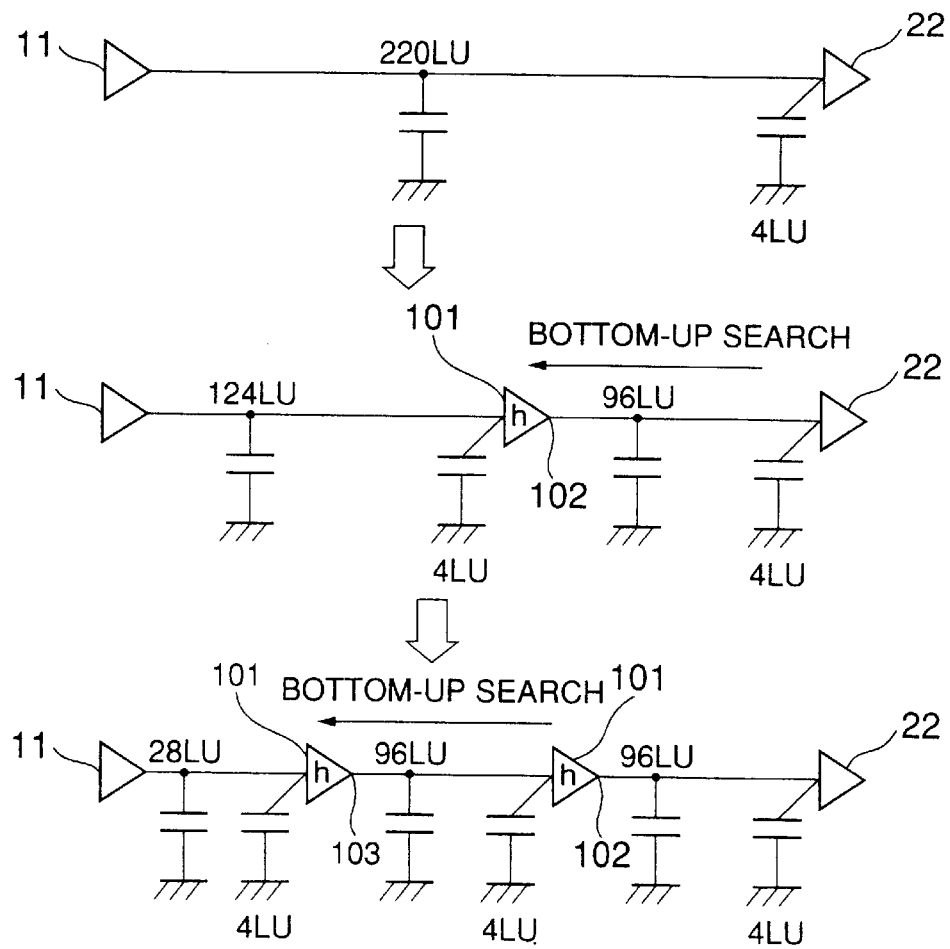
FIG. 2 is a simplified circuit net diagram depicting the result of using the prior art repeater insertion method for a one-fanout net.

In FIG. 2, the driver 11 drives a 224LU load. This load exceeds the threshold level, so a repeater cell location search is done from the fanout node 224 to the driver 11, i.e. a "bottom-up" search, and a first repeater cell 101 location 102 is found, such that the interval capacitance, i.e. capacitance between nodes 22 and 102, is no greater than about 100LU (96LU+4LU).

The interval capacitance between the driver 11 and repeater cell 101 exceeds 100LU (it is 128LU, 124LU+4LU). Therefore, a second bottom-up search, is necessitated, and a second repeater cell 101 location 103 is found such that the interval capacitance, i.e. capacitance between nodes 102 and 103, is no greater than about 100LU (96LU+4LU).

Figure 3:
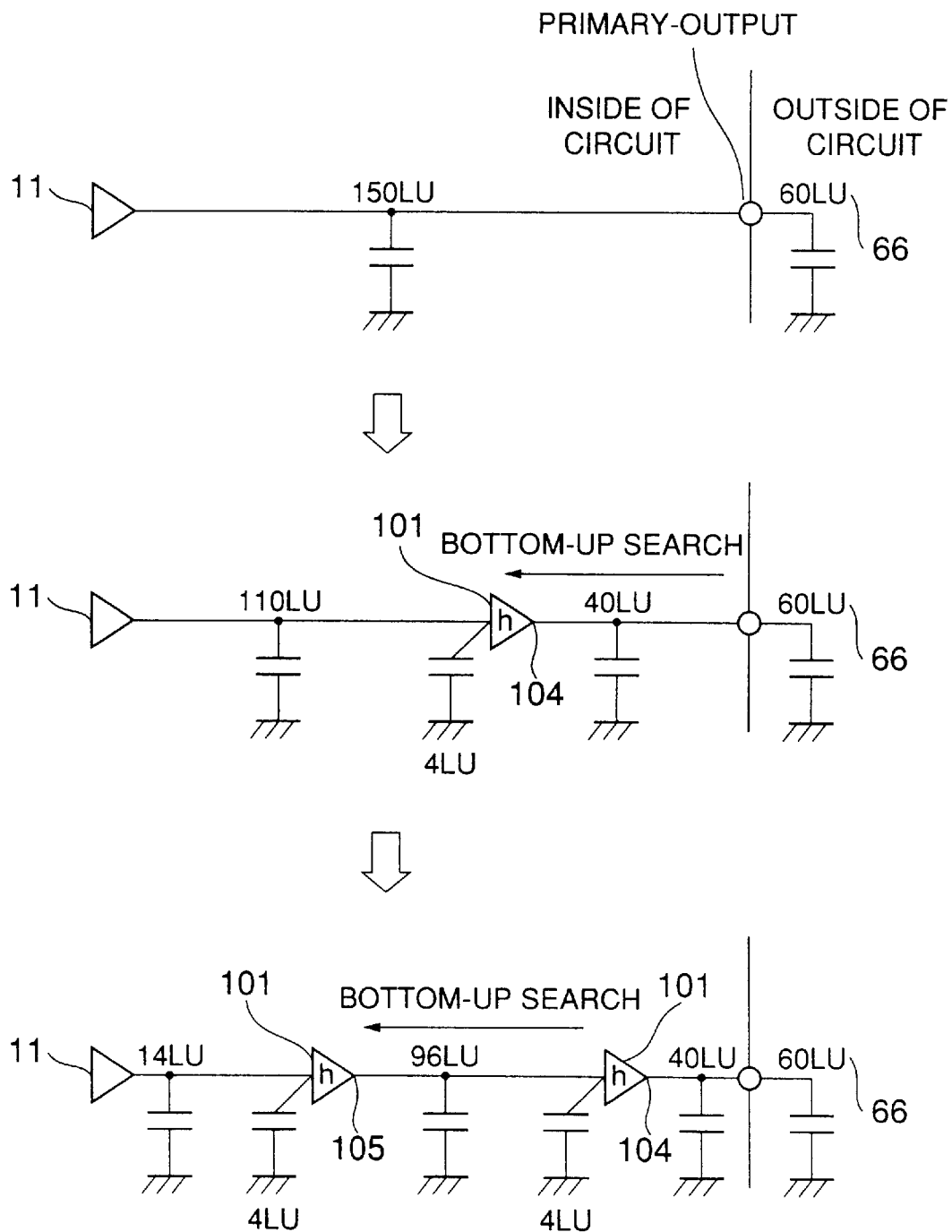
FIG. 3 is a simplified circuit net diagram depicting the result of using the prior art repeater insertion method for a one primary-output net.

Likewise, in FIG. 3, a primary-output load 66 of 60LU is taken into consideration in determining repeater cell insertion location. Again, a repeater cell location search is performed from the primary-output load 66 to the driver 11, i.e. a "bottom-up" search, and a first repeater cell 101 location 104 is found such that interval capacitance, i.e. capacitance between nodes 66 and 104, is no greater than about 100LU (40LU+60LU).

The interval capacitance between driver 11 and repeater cell 101 exceeds 100LU (it is 114LU, 110LU +4LU), so a second bottom-up search, is necessitated, and a second repeater cell 101 location 105 is found such that interval capacitance, i.e. capacitance between nodes 104 and 105, is no greater than about 100LU (96LU+4LU).

Figure 4:
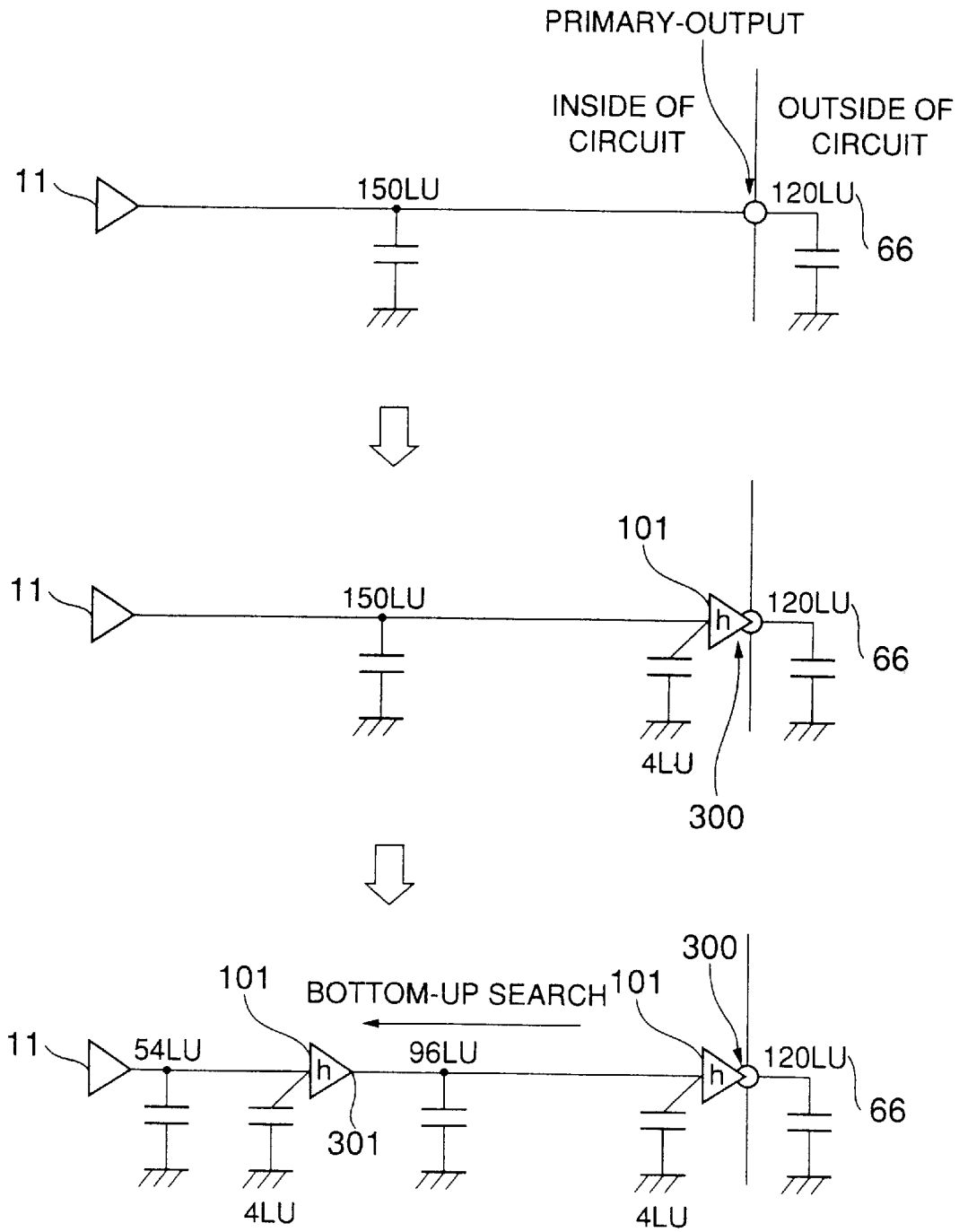
FIG. 4 is a simplified circuit net diagram depicting the result of using the prior art repeater insertion method with one type of repeater cell for a heavy primary-output net.

FIG. 4 is a simplified circuit not diagram depicting the result of using the prior art repeater insertion method with one type of repeater cell for a heavy primary-output net. Driver 11 drives an extremely large load 66. However, interval capacitance between driver 11 and load 66 exceeds 100LU, therefore repeater cell insertion is required in order to reduce interval capacitance.

In this situation, a repeater cell 101 is located 300 at the extremely large load 66. However, interval capacitance between driver 11 and repeater cell 101 exceeds 100LU. Thus, a "bottom-up" search is performed, and repeater cell 101 location 301 is determined such that interval capacitance between nodes 300 and 301 is no greater than about 100LU. Since interval capacitance between driver 11 and repeater cell 101 does not exceed 100LU, no further "bottom-up" search is required as interval capacitance, i.e. capacitance between nodes 11 and 301, is no greater than about 100LU.

As can be seen from FIG. 4, the "H-buffer" repeater cell 101 sometimes is forced to drive loads in excess of 100LU. This heavy load 66 causes a large signal delay.

Current commercial repeater insertion methods, such as those described above, achieve inadequate results when applied to two or more fanout nets.

Repeater Insertion Data Flow

FIG. 13 represents the best mode contemplated by this invention in order to overcome the problems of the prior art. Referring to FIG. 13, a Repeater Location Calculator 10 is responsible for determining proper repeater cell 101 location within the nets. In the preferred embodiment, the method of the present invention is practiced by a software program, in conjunction with, the Aguarius-XO (AXO) 20 deep submicron software product from AvantX Corporation, operating in Unix or any comparable operating system.

The AXO 20 is a cell-based "place-and-route" software tool used to design mixed standard-cell and gate-array integrated circuits. It is a timing-driven hierarchical place and route system that supports mixed cell-based and complex gate array designs in a unified environment.

The AXO 20 generates a Verilog-HDL netlist 9 as well as a Repeater Prohibited Module/Region File 12, a DSPF file (Detailed Standard Parasitic Format) 13 which contains capacitance and resistance values of every net in the circuit, an Output Pin Capacitance File 14, and a Rectangular Layout Area file 15.

Repeater Location Calculator 10 then utilizes those files with exception of the Verilog-HDL Netlist 9, but with three additional user-generated files, a Parameter file 16 which contains the threshold values and the interval capacitance values for the Calculator 10, a "Don't Touch Net" List file 17, and a Slack of Each Fanout file 18.

Upon performing its calculations, the Repeater Location Calculator 10 then generates a Verilog-HDL Netlist Change File 19, an AXO Repeater Placement File 21, and a DSPF with Repeater file 22.

The AXO 20 then generates two additional files, a Repeater Prohibited Physical Area information file 23, and a Pre-assigned Other Cell information file 24. Those files, in addition to the Verilog-HDL Netlist Change file 19, the AXO Repeater Placement file 21, and the Rectangular Layout Area file 15 are utilized by the Repeater Relocater 30 to remove physical overlapping of repeater cells 101 and to fit repeater cells 101 along the cell grid.

Figure 26:
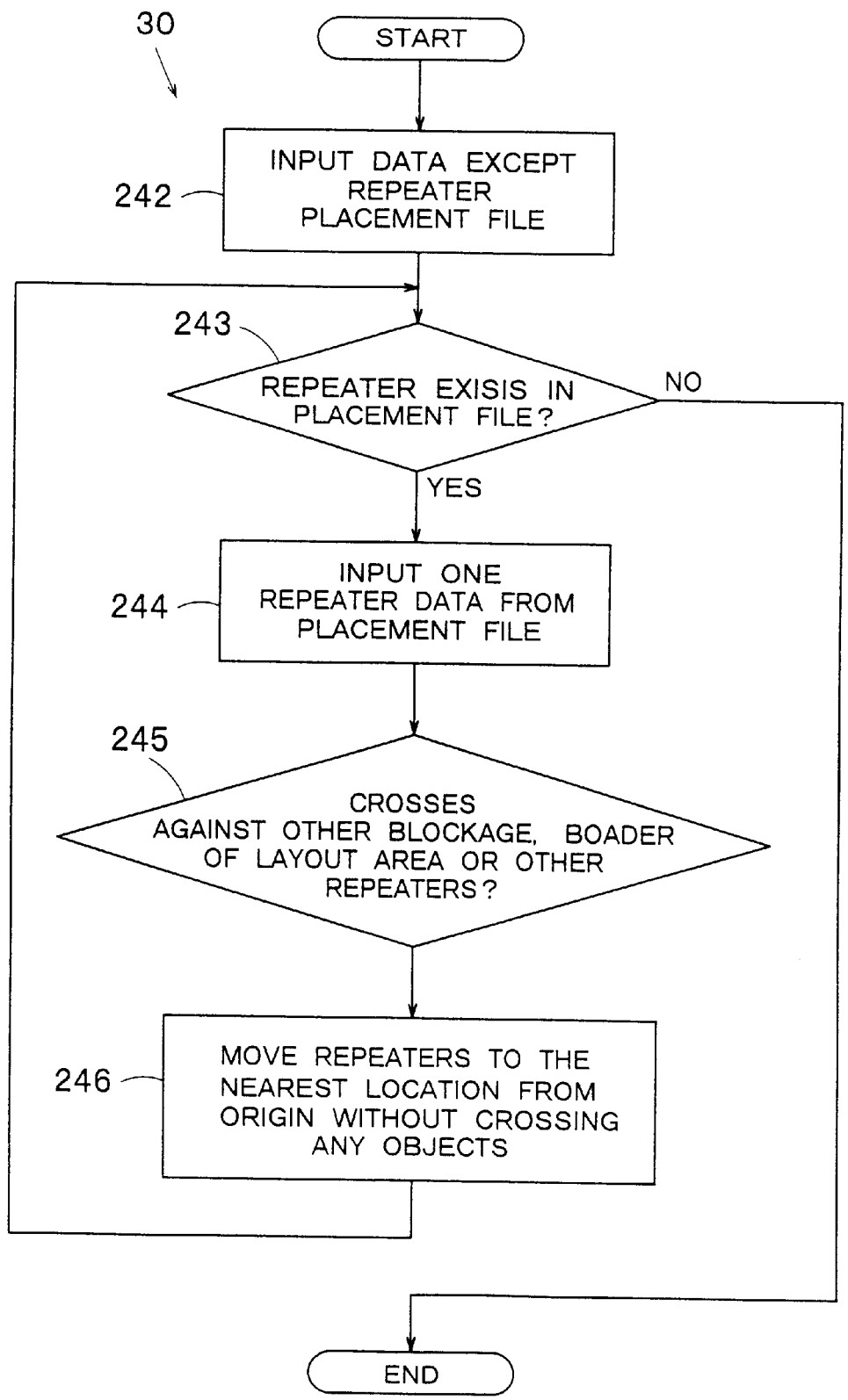
FIG. 26 is a detailed flowchart of the Repeater Relocater operation.

FIG. 26 describes the operation of the Repeater Relocater 30. Initially, the Verilog-HDL Netlist Change file 19, the Repeater Prohibited Physical Area (Blockage) Information file 23, the Pre-assigned Other Cell Information file 24, and the Rectangular Layout Area file 15 are read 242 into the Repeater Relocater 30.

The Repeater Relocater 30 then queries 243 whether a repeater cell 101 exists in the placement file 21 If the result of this query 243 is YES, then one repeater datum is input 244 from the AXO Repeater Placement file 21. That repeater cell 101 position is then compared 245 against other blockage/border layout area/other repeaters to determine whether the two intersect. If they intersect, the repeater cell 101 is moved 246 to the nearest location from the origin without crossing any objects. The operation continues until no repeater cells 101 exist in the placement file 21. The resulting information is output to an updated AXO Repeater Placement file 25.

A Verilog-RDL Netlist Fixer 40 compares the original Verilog-HDL Notlist 9 and the Verilog-HDL Netlist Change file 19 generated from the Repeater Location Calculator 10 and generates a resulting Verilog-HDL Netlist with Repeater file 26.

Both the Verilog-HDL Netlist with Repeater file 26 and the updated AXO Repeater Placement file 25 are read back into the AXO in order to generate the proper software layout.

Additionally, the AXO Repeater Placement file 21 is read by the Design Compiler Set_Dont_Touch Command File Generator 50 and a Set_Dont Touch Command file 27 is generated to be utilized by the Design Compiler 60. This Set_Dont_Touch Command file 27 is passed to the Synopsys' Design Compiler 60 so that the repeater cells 101 may not be changed nor removed by the Design Compiler 60 at a later time.

The following chart indicates the novel aspects of the present invention.

| NEW | OLD |
| --- | --- |
| Repeater Location Calculator 10 | AXO 20 |
| Repeater Relocater 30 | Repeater Prohibited Module/Region file 12 |
| Verilog-HDL Netlist Change file 19 | DSPF 13 |
| AXO Repeater Placement file 21 | Output Pin Capacitance file 14 |
| Layout DSPF with Repeater file 22 | Rectangular Area file 15 |
| | Verilog-HDL Netlist 9 |
| Verilog-HDL Netlist Fixer 40 | Repeater Prohibited Physical Area file 23 |
| Verilog-HDL Netlist with Cell Repeater file 26 | Pre-assigned Other information file 24 |
| updated AXO Repeater command Placement file 25 | Set_Dont_Touch command file Generator 50 |
| | Set_Dont_Touch command file 27 |
| | Design Compiler 60 |

Repeater Location Calculator Operation

Figure 14:
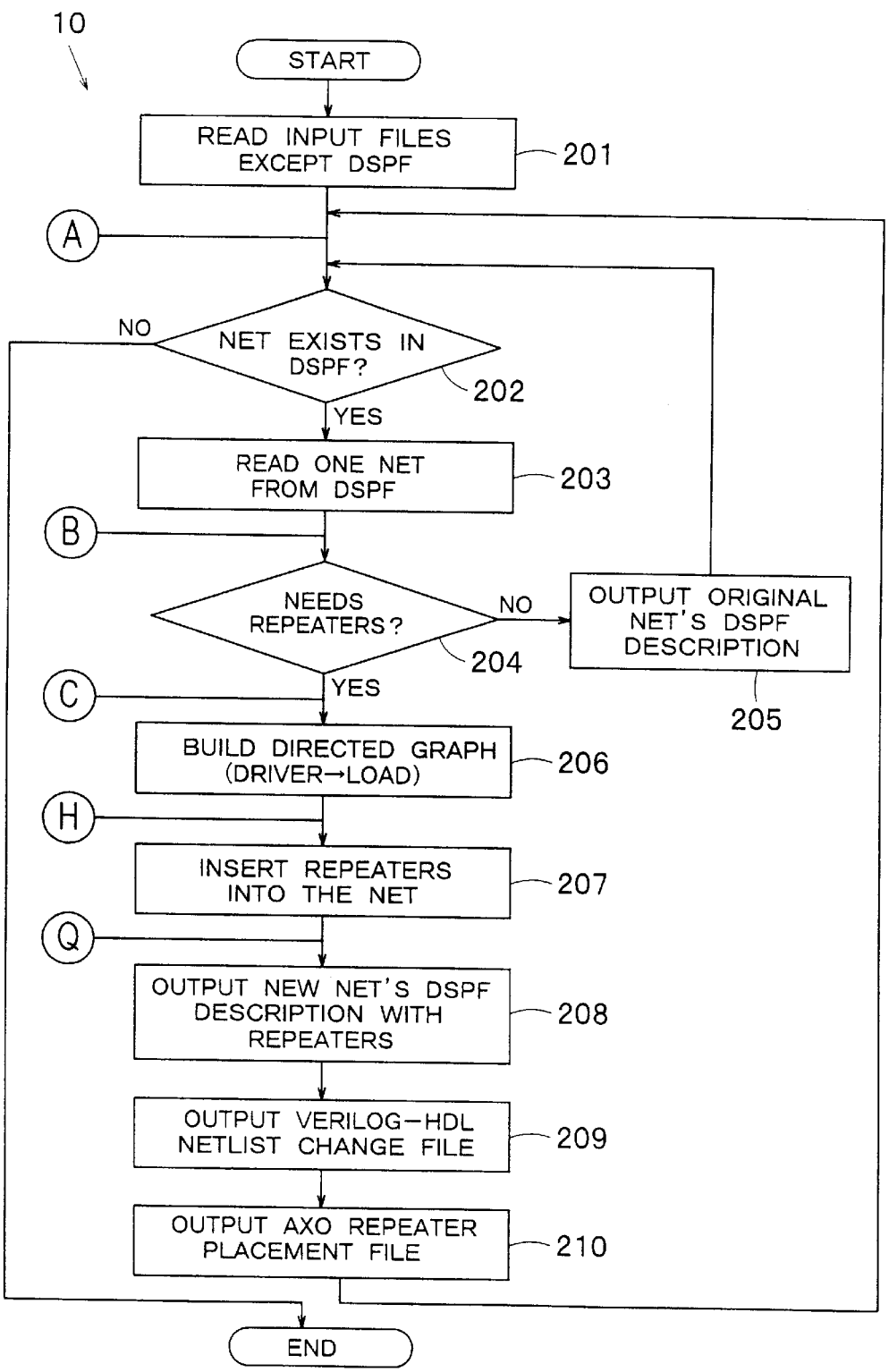
FIG. 14 is a detailed flowchart of the Repeater Location Calculator operation

The Repeater Location Calculator 10 operation will now be described. FIG. 14 is a detailed flowchart of the Repeater Location Calculator 10. Referring to FIG. 14, the Repeater Location Calculator 10 reads all input files (Parameter 16, "Don't Touch Net" List 17, Slack of Each Fanout 18, Repeater Prohibited Module/Region 12, Output Pin Capacitance 14, and Rectangular Layout Area 15) except the DSPF 13 and determines whether a net exists in the DSPF 13 (referenced by point A in the Figure) 201. If the result of this query 202 is NO, then there is no need for repeater cell 101 insertion, and the operation ends.

However, if the result of this query 202 is YES, then one net is read 203 from the DSPF 13 and a second query (Needs Repeaters?) 204 determines whether repeaters are required (referenced by point B in the Figure).

Figure 15:
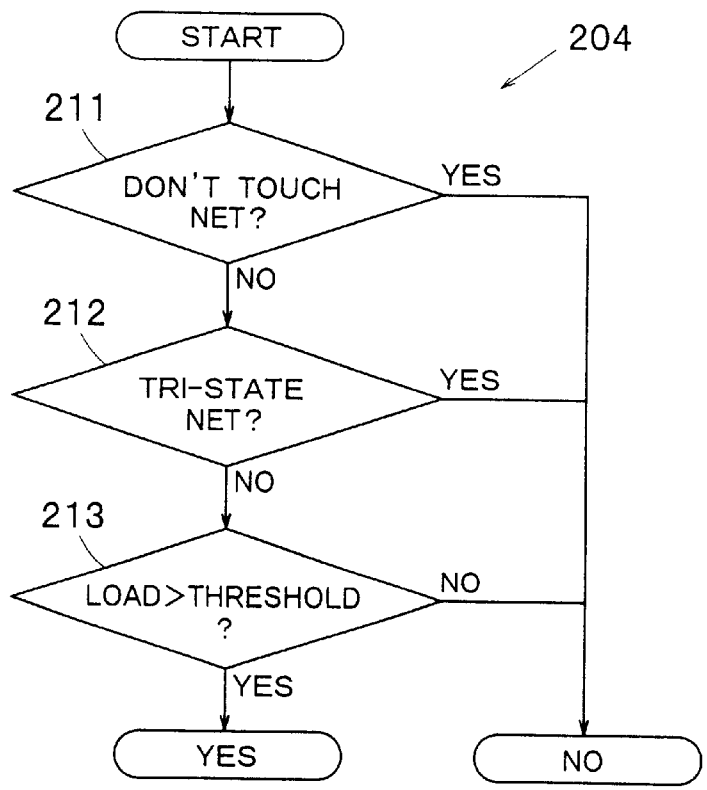
FIG. 15 is a simplified flowchart of the Needs Repeater? operation decision tree called from the Repeater Location Calculator.

Referring to FIG. 15, the Needs Repeater? 204 decision tree determines three separate queries. First, the Needs Repeater? 204 decision tree questions whether this net is a Don't Touch Not 211 (indicated by the "Don't Touch Net" list 17 read by the Repeater Location Calculator 10). If the result of this query 211 is YES, then no repeater cell 101 is required and the original net's DSPF 13 description is output 205 to point A in FIG. 14 and the cycle repeats until no net exists 202 in DSPF 13.

Returning to FIG. 15, if the result of the first query (Don't Touch Net) 211 is NO, then a second query 212, whether this net is a tri-state net, is determined. If the result of this query 212 is YES, then no repeater cell 101 is required and the original net's DSPF 13 description is output 205 to point A in FIG. 14 and the cycle repeats until no net exists 202 in DSPF 13.

Returning to FIG. 15, if the result of this second query (Tri-State Net) 212 is NO, then a third query 213, whether the load exceeds the threshold, is determined. If the result of this query 213 is NO, then no repeater cell 101 is required and the original net's DSPF 13 description is output 205 to point A in FIG. 14 and the cycle repeats until no net exists 202 in DSPP 13.

Returning to FIG. 15, if the result of this third query 213 is YES, then as illustrated in FIG. 14, the Build Directed Graph operation 206 is called by the Repeater Location Calculator 10 (referenced by point C in the Figure).

Figure 16:
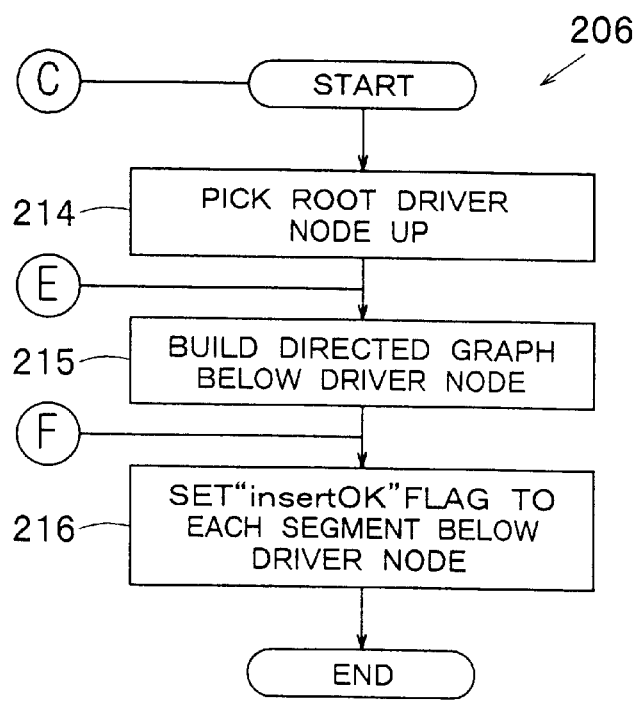
FIG. 16 is a detailed flowchart of the Build Directed Graph operation called from the Repeater Location Calculator.

Referring now to FIG. 16, the Build Directed Graph operation 206 will be explained. Initially, a root driver node 11 is determined (Pick Root Driver Node Up) 214 and a directed graph is "built" below the driver node 215 from the driver 11 to the load 66 (referenced by point E in the Figure).

Figure 17:
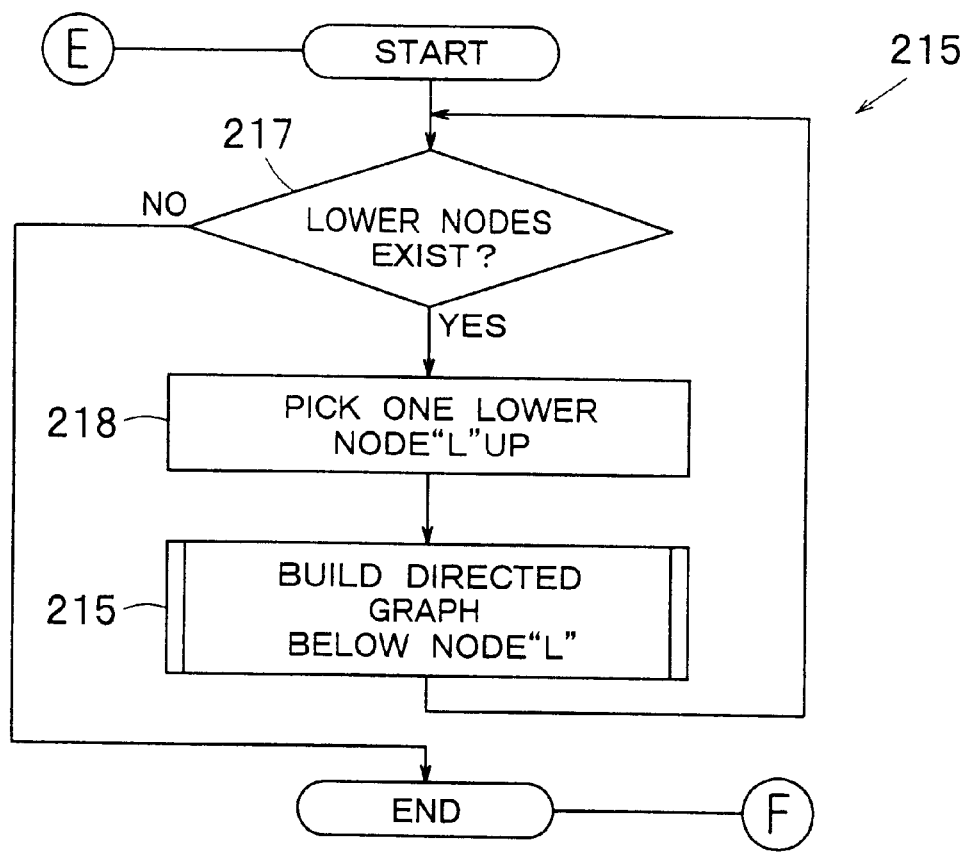
FIG. 17 is a detailed flowchart of the Build Directed Graph Below Node operation called from the Build Directed Graph operation.

FIG. 17 depicts the operation of the Build Directed Graph Below Node operation 215. A query to determine whether any lower nodes exist 217 is performed (Lower Nodes Exist?). If the result of this query 217 is YES, then a lower node is determined 218 and the Build Directed Graph Below Node 215 operation is recursively called to again query whether any lower nodes exist 217 from that node. The cycle continues until the result of this query 217 is NO, and operation returns to the Build Directed Graph 206 operation (referenced by point F in the Figure).

To better exemplify the Build Directed Graph 206 operation described above, reference will be made to FIGS. 27A, 27B, 27C, and 28A, 28B, and 28C. First, with reference to FIGS. 27A, 27B, and 27C, a simple circuit net diagram having two fanouts is represented as FIG. 27A. The identical circuit net can be represented another way as that of FIG. 27B. Initially, a driver node is determined 214 (referenced in FIG. 27B by node UDW). A query 217 is performed to determine whether any lower nodes exist. As can be seen from FIG. 27B, the result of this query 217 is YES, therefore, a lower node is determined (referenced by node "N2" in FIG. 27B), and the Build Directed Graph Below Node operation 215 is recursively called to determine whether any lower nodes exist 217 from the node. As can be seen the result of this query 217 is YES, therefore a lower node is determined (referenced by nodes "N1" and "N2" in FIG. 27B), and the Build Directed Graph Below Node operation 215 is recursively called to determine whether any lower nodes exist 217. As can be seen from FIG. 27B, the result of this query 217 is YES, therefore a lower node is determined (referenced by nodes "N1" and "N2" in FIG. 27B; L1 is the lower node of N1, whereas L2 is the lower node of N3), and the Build Directed Graph Below Node operation 215 is recursively called to determine whether any lower nodes exist 217. This time, the result of this query 217 is NO, therefore, operation returns to the Build Directed Graph 206 operation (point F in FIG. 16).

FIG. 27C represents the result of the circuit net of FIG. 27B after the Build Directed Graph 206 operation has been performed on the circuit net. Note in FIG. 27C that nodes "N1" and "N2" are the lower nodes of node "N2".

Similarly, with reference to FIGS. 28A, 28B, and 28C, a complex circuit net diagram is represented as FIG. 28A. The identical circuit can be represented another way as that of FIG. 28B. Initially, a driver node is determined 214 (referenced in FIG. 28B by node "D"). A query 217 is performed to determine whether any lower nodes exist. As can be seen from FIG. 28B, the result of this query 217 is YES, therefore, a lower node is determined (referenced by node "N4" in FIG. 28B), and the Build Directed Graph Below Node operation 215 is recursively called to determine whether any lower nodes exist 217 from the node. As can be seen the result of this query 217 is YES, therefore a lower node is determined (referenced by nodes "N2" and "N5" in FIG. 28B). and the Build Directed Graph Below Node operation 215 is recursively called to determine whether any lower nodes exist 217. As can be seen from FIG. 27B, the result of this query 217 is YES, therefore a lower node is determined (referenced by nodes "N1" and "N2" in FIG. 27B), and the Build Directed Graph Below Node operation 215 is recursively called to determine whether any lower nodes exist 217. The result of this query 217 is YES, therefore a lower node is determined (referenced by node "N8" in FIG. 28B; N6 is also the lower node of N5) , and the Build Directed Graph Below Node operation 215 is recursively called to determine whether any lower nodes exist 217. Again, the result of this query 217 is YES, therefore a lower node is determined (referenced by node "N7" in FIG. 28B), and the Build Directed Graph Below Node operation 215 is recursively called to determine whether any lower nodes exist 217. Again, the result of this query 217 is YES, therefore a lower node is determined (referenced by node "L4" which is the lower node of "N7" in FIG. 28B, and also "L5" which is the lower node of "N8"), and the Build Directed Graph Below Node operation 215 is recursively called to determine whether any lower nodes exist 217. No more lower nodes exist in FIG. 28B, therefore, operation returns to the Build Directed Graph 206 operation (point F in FIG. 16).

FIG. 28C represents the result of the circuit net of FIG. 28B after the Build Directed Graph 206 operation has been performed on the circuit net.

Returning now, to FIG. 16 (referenced by point F in the Figure). the Set "InsertOK" Flag to Each Segment Below Node operation 216 is called by the Build Directed Graph operation 206.

Figure 18:
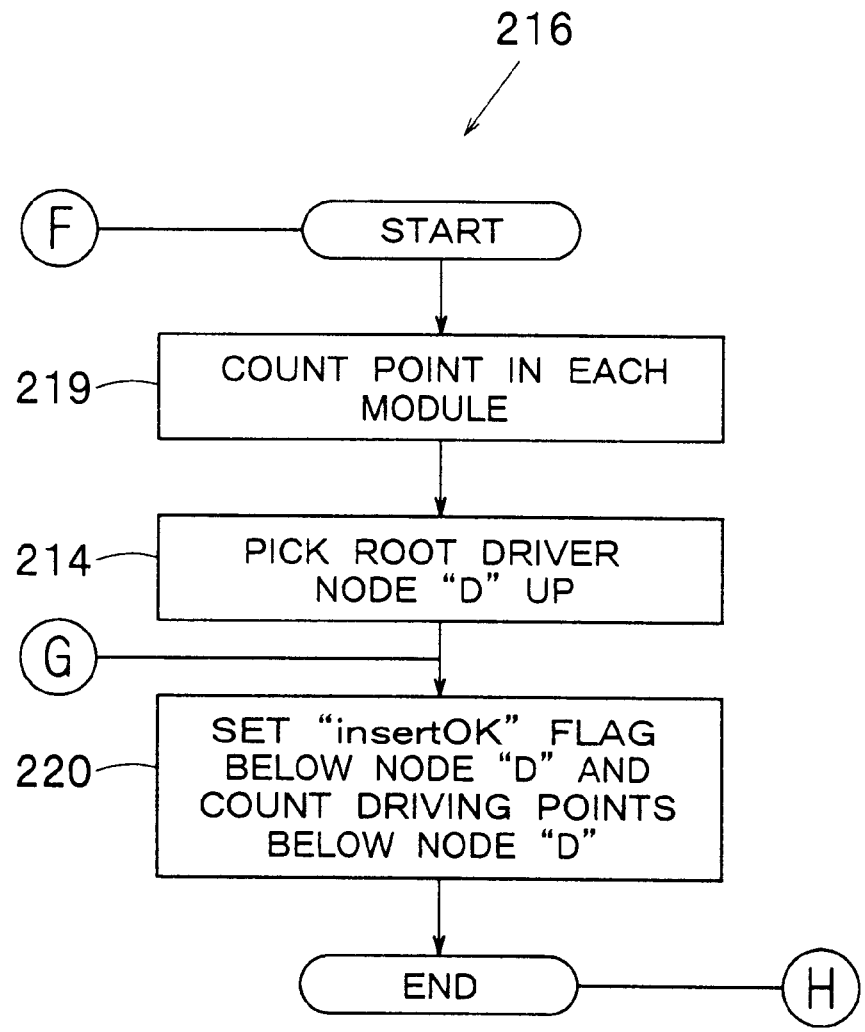
FIG. 18 is a simplified flowchart of the Set "InsertOK" Flag Below Specified Node operation.

FIG. 18 depicts the simplified flowchart of the Set "InsertOK" Flag to Each Segment Below Node operation 216. Initially, the number of node points in each module are determined 219, and a root driver node 11 is determined 214. Then, the Set "InsertOK" Flag Below Node and Count Points Below Node operation 220 is called from the Set "InsertOK" Flag to Each Segment Below Node operation 216 (referenced by point G in the Figure).

Figure 19:
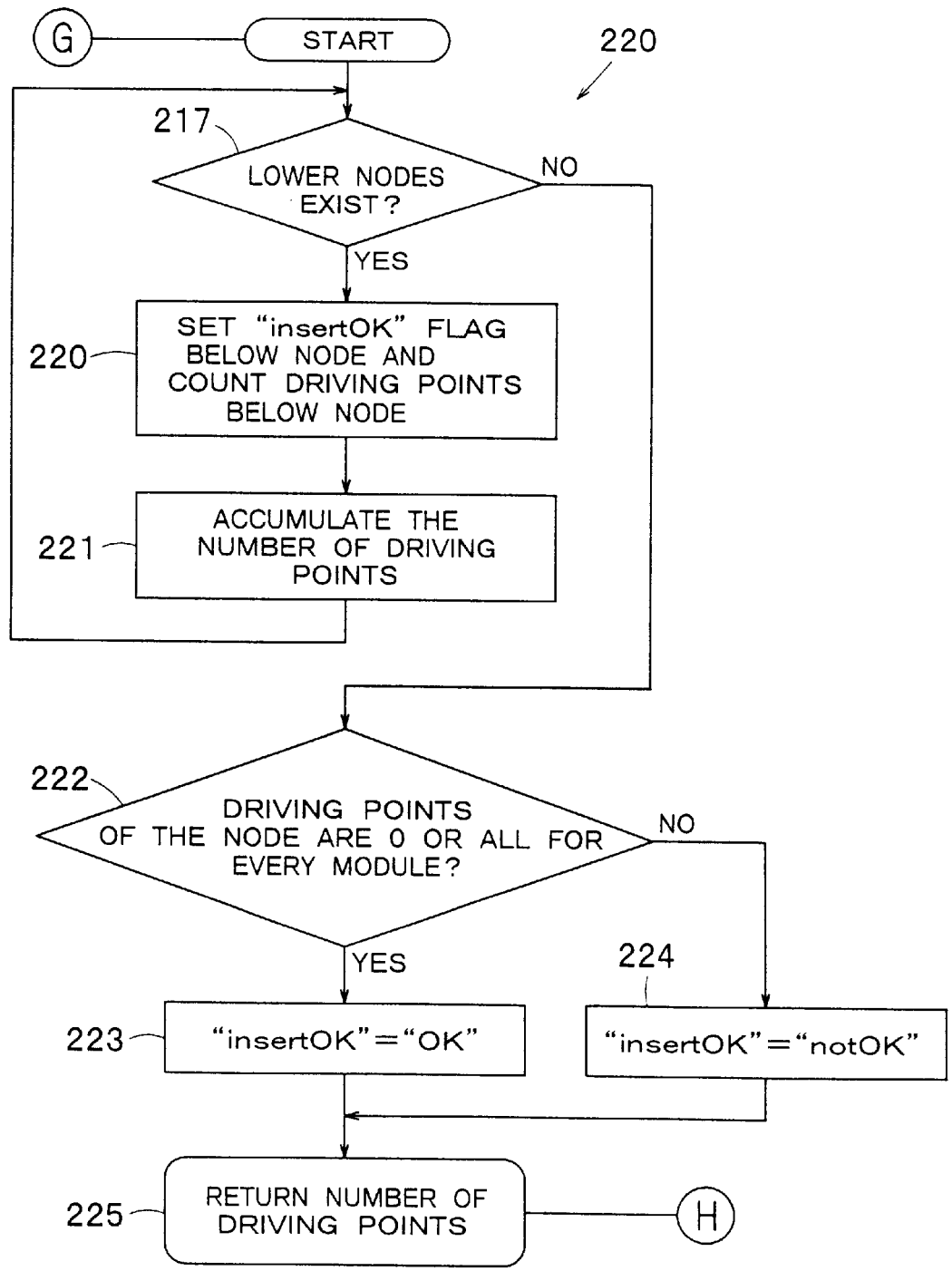
FIG. 19 is a detailed flowchart of the Set "InsertOK" Flag Below Node & Count Driving Points Below Node operation called from the Build Directed Graph operation.

FIG. 19 illustrates the Set "InsertOK" Flag Below Node and Count Driving Points Below Node operation 220. Initially, a query to determine whether any lower nodes exist 217 is performed (Lower Nodes Exist?). If the result of this query 217 is YES, the Set "InsertOK" Flag Below Node and Count Driving Points Below Node operation 220 is recursively called, the number of driving points is accumulated 221 and the cycle continues until the result of the query 217 (Lower Nodes Exist?) is NO.

Then, a second query 222 is performed to determine whether the number of driving points of the node are either "0" or "ALL" for every module. If the result of this query 222 is YES, then the "InsertOK" flag is set to "OK" 223. If the result of this query 222 is NO, then the "InsertOK" flag is set to "notOK" 224. In either case, the number of driving points for the node are returned 225 by the Set "InsertOK" Flag Below Node and Count Driving Points Below Node operation 220 (referenced by point H in the Figure).

Figure 20:
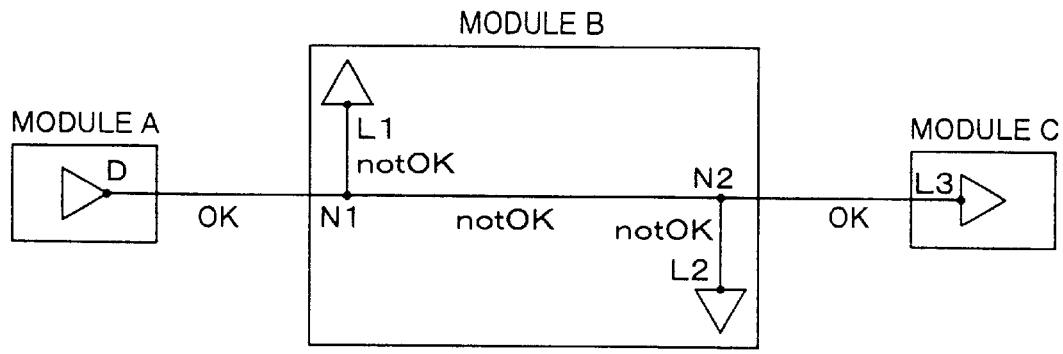
FIG. 20 is an illustration of the result of the Set "InsertOK" Flag Below Specified Node operation

To better illustrate the Set "InsertOK" Flag Below Node and Count Driving Points Below Node operation 220, the following charts in combination with the illustration in FIG. 20, represent a sample three module net (module A, module B, and module C) and indicate the status of the flag setting at each node within the modules.

| | Point: Driver, Load Node: Intersection, Point Module \| # of Points A 1 B 2 C 1 | |
| --- | --- | --- |
| Node | Driving Points | InsertOK? |
| L1 | Bx1 | notOK |
| L2 | Bx1 | notOK |
| L3 | Cx1 | OK |
| N1 | Bx2, Cx1 | OK |
| N2 | Bx1, Cx1 | notOK |

If the driving points of a node are 0 for each module, the segment just above the node has "minsertOK"=OK.

Figure 21:
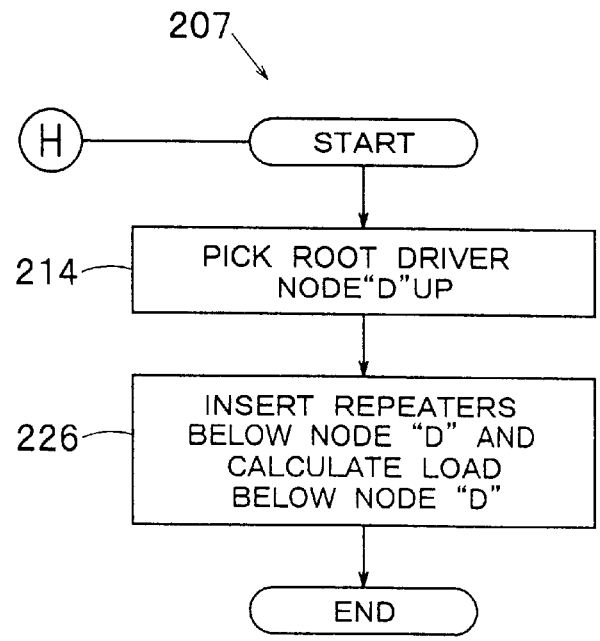
FIG. 21 is a simplified flowchart of the Insert Repeaters operation called by the Repeater Location Calculator.

Returning to FIG. 14 (referenced by point H in the Figure), the Insert Repeaters Into the Net operation 207 is then called by the Repeater Location Calculator 10. Referring then, to FIG. 21, the Insert Repeaters Into the Net operation 207 will be illustrated.

Initially, the root driver node 11 is determined 214 and the Insert Repeaters Below Node and Calculate Load Below Node operation 226 is performed.

Figure 22:
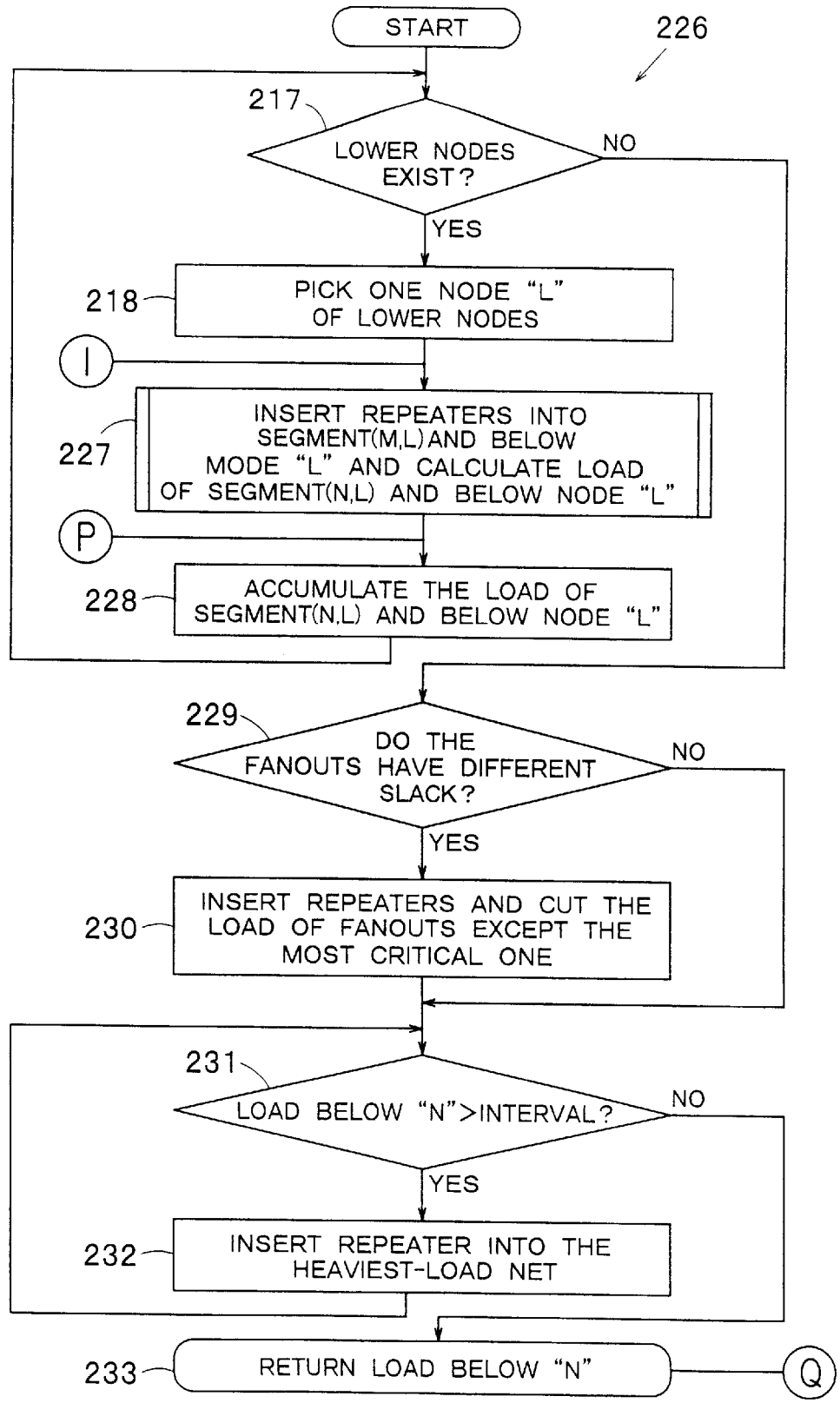
FIG. 22 is a detailed flowchart of the Insert Repeaters Below Node and Calculate Load Below Node operation called by the Repeater Location Calculator.

FIG. 22 depicts the Insert Repeaters Below Node and Calculate Load Below Node operation 226. Initially, a query (Lower Nodes Exist?) 217 is performed to determine whether any lower nodes exist. If the result of this query 217 is YES, then a lower node is chosen 218 and the Insert Repeaters Into Segment(N,L) and Below Node and Calculate Load of Segment(N,L) and Below Node operation 227 is called (referenced by point I in the Figure).

Figure 23:
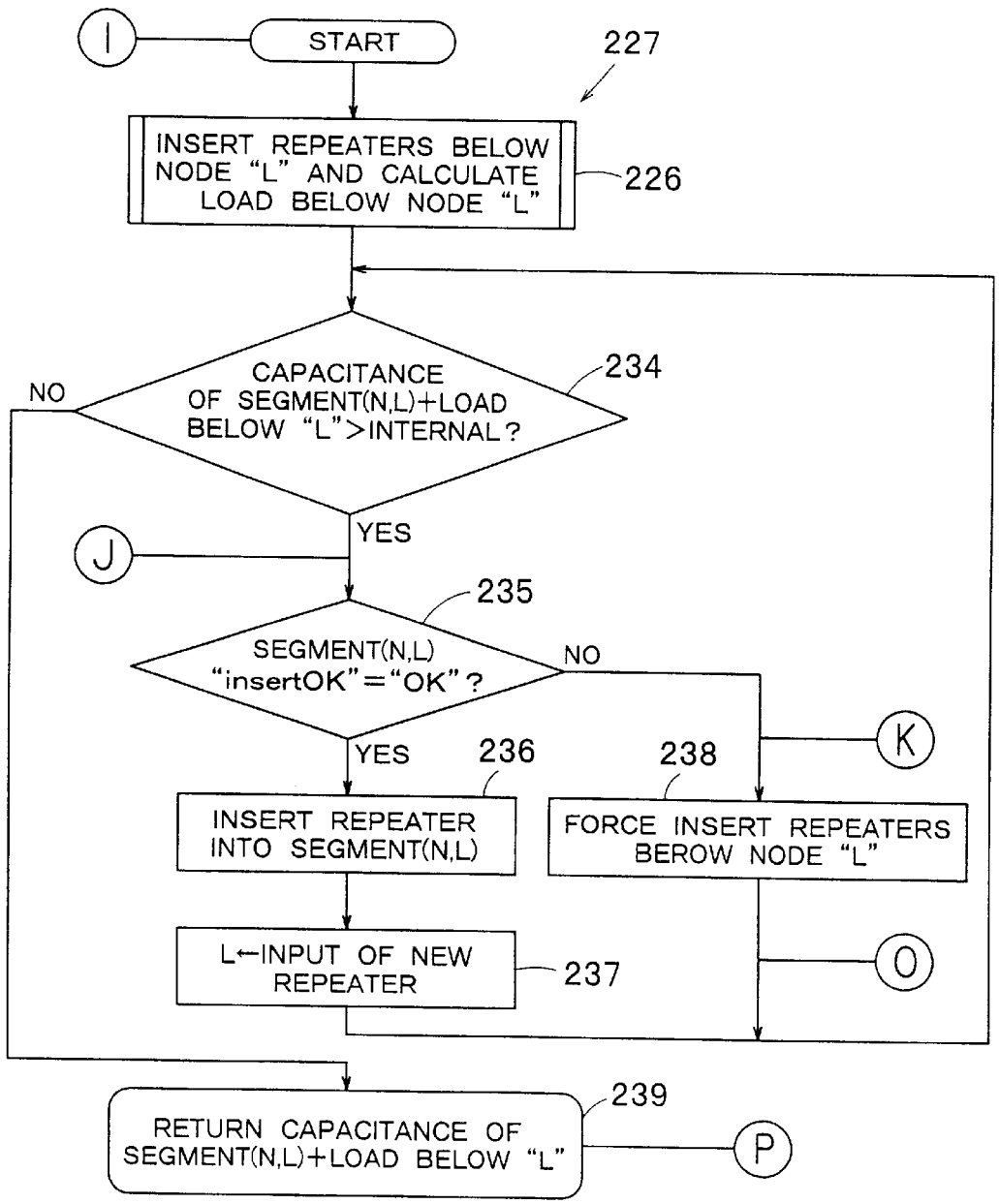
FIG. 23 is a detailed flowchart of the Insert Repeaters into Segment (N,L) and Calculate Load of Segment (N,L) Below Node operation called by the Insert Repeaters Below Node operation.

FIG. 23 illustrates the Insert Repeaters Into Segment(N,L) and Below Node and Calculate Load of Segment(N,L) and Below Node operation 227. Initially, the Insert Repeaters Below Node and Calculate Load Below Node operation 226 is called. Then, a query 234 is performed to determine whether the total capacitance of the segment (Segment(N, L)) and the load below the node is greater than the interval capacitance. If the result of this query 234 is YES, a second query 235 (referenced by point J in the Figure) is performed to determine whether the segment (Segment(N,L)) has its "InsertOK" flag set to "OK". If the result of this second query 235 is YES, then a repeater cell 101 Is inserted into the segment (Segment(N,L)) 236, the input of the new repeater cell is set 237 to node "L", and the cycle is continued until the result of the first query 234 (i.e. whether the total capacitance of the segment (Segment(N,L)) and the load below node is greater than the interval capacitance) is NO, in which case the total capacitance of the segment (Segment (N,L) ) and the load below node are returned 239 (referenced by point P in the Figure).

Figure 24:
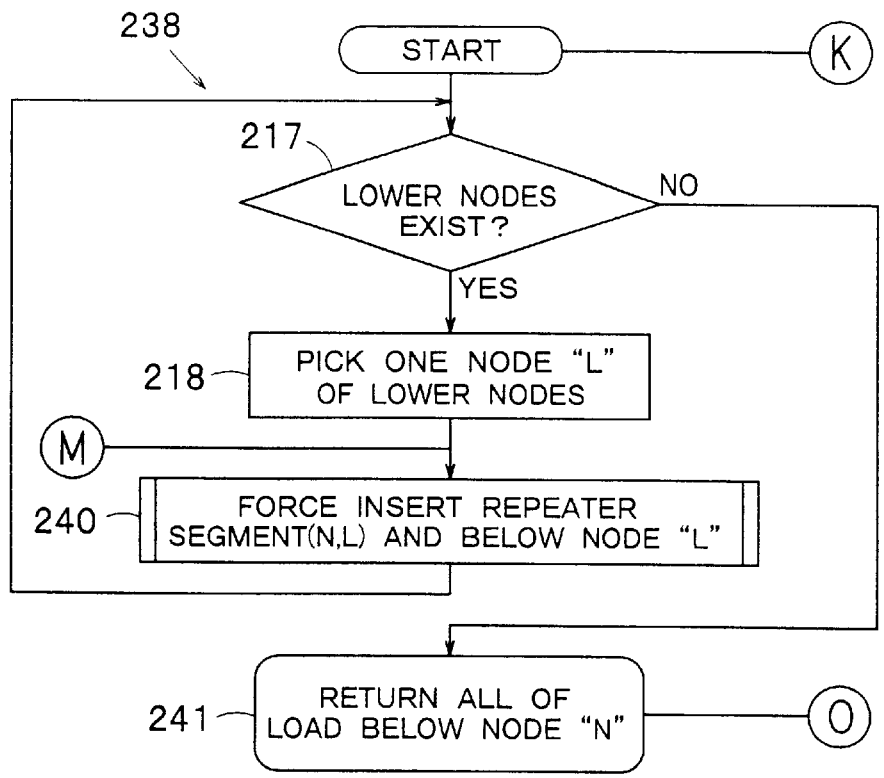
FIG. 24 is a detailed flowchart of the Force Insert Repeaters Below Node operation called by the Insert Repeaters into Segment (N,L) and Calculate Load of Segment (N,L) Below Node operation.

Referring still to FIG. 23, if the result of the query 235 at reference point J (whether the "InsertOK" flag is set to "OK" at Segment (N,L)) is NO, the Force Insert Repeaters Below Node operation 238 is called (referenced by point K in the Figure). FIG. 24 depicts the Force Insert Repeaters Below Node operation 238. Initially, a query 217 (Lower Nodes Exist?) is performed to determine whether any lower nodes exist. If the result of this query 217 is YES, then a lower node is chosen 218 and the Force Insert Repeater into Segment(N,L) and Below Node operation 240 is called (referenced by point M in the Figure).

Figure 25:
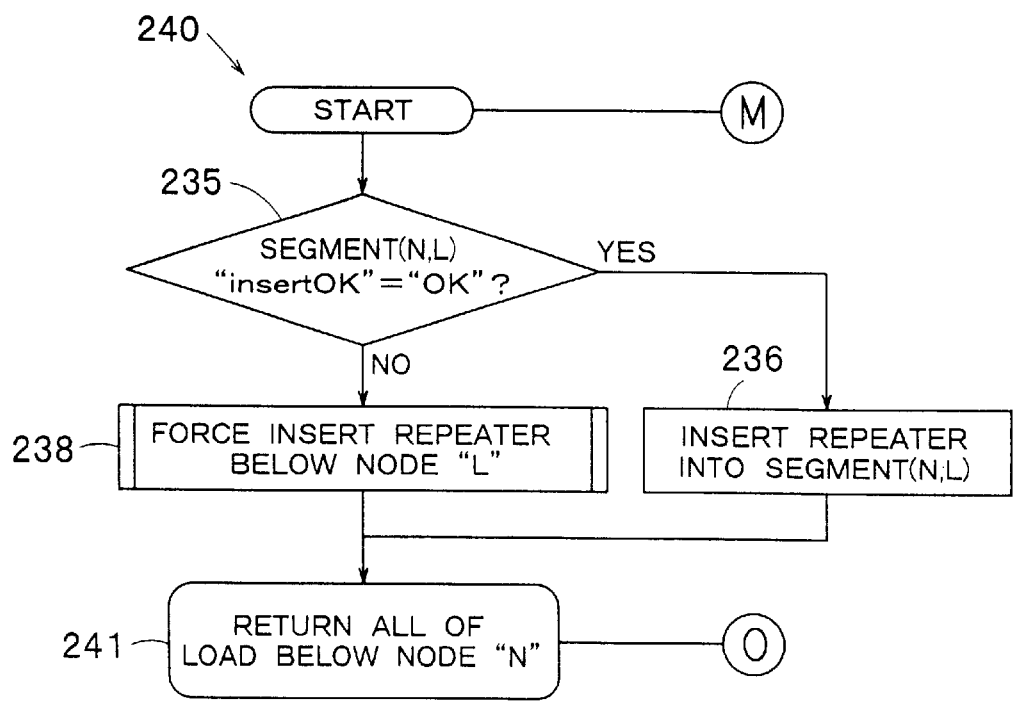
FIG. 25 is a detailed flowchart of the Force Insert Repeater Segment (N,L) and Below Node operation called by the Force Insert Repeaters Below Node operation.

FIG. 25 illustrates the Force Insert Repeater into Segment (N,L) and Below Node operation 240. Initially, a query 235 is performed to determine whether the "InsertOK" flag in the segment (Segment(N,L)) is set to "OK". If the result of this query 235 is YES, then a repeater cell 101 is inserted into that segment (Segment(N,L)) 236 and the load below node is returned 241 to the Force Insert Repeaters Below Node operation 238.

However, if the result of this query 235 is NO, then the Force Insert Repeater Below Node operation 238 is recursively called by the Force Insert Repeater into Segment(N, L) and Below Node operation 240 and the operation described above at point M is performed until no lower nodes exist and the load below node is returned 241 to the Insert Repeaters into Segment(N,L) and Below Node and Calculate Load of Segment(N,L) and Below Node operation 227 depicted in FIG. 23 (referenced by point O in the Figure).

Returning then, to FIG. 23, the query cycle (i.e. whether the capacitance of the total of the segment (Segment(N,L)) and the load below node is greater than the interval capacitance) is continued until the result of the query 234 is NO, in which case the value of the total capacitance of the segment (Segment(N,L)) and load below node is returned 239 (referenced by point P in the Figure).

Returning to point P in FIG. 22, the load of the segment (Segment(N,L)) and below node is accumulated 228 and the query 217 (i.e. whether any lower nodes exist) is continued until the result of the query 217 is NO, in which case a second query 229 (Fanout Different Slack?) is performed to determine whether the fanouts have different slack values. If the result of this query 229 is YES, then a repeater cell 101 is inserted into each of the less-critical fanouts 230. If the result of this query 229 is NO, then the above step is not performed and the operation performs a third query 231 (Load Below "N" >Interval?) to determine whether the load below the node is greater than the interval capacitance.

If the result of this query 231 is YES, then a repeater cell 101 is inserted into the heaviest load net 232 and the query 231 is again performed and the cycle continued until the result of the query 231 (i.e. whether the load below the node is greater than the interval capacitance) is NO, in which case the value of the load below the node is returned 233 (referenced by point Q in the Figure).

Returning to FIG. 14, the net's DSPF with repeater file 22 is generated 208, the Verilog-HDL Netlist Change file 19 is generated 209 and the AXO Repeater Placement file 21 is generated 210. At this point, no more nets exist in the DSPF 13 so the Repeater Location Calculator 10 operation ends. The following examples will illustrate the repeater insertion method described above.

EXAMPLE 1

Figure 5B:
FIG. 5B is a representation of the result of the two-fanout net of FIG. 5A after the Set "InsertOK" Flag Below Node and Count Driving Points Below Node operation has been performed.
Figure 5B:
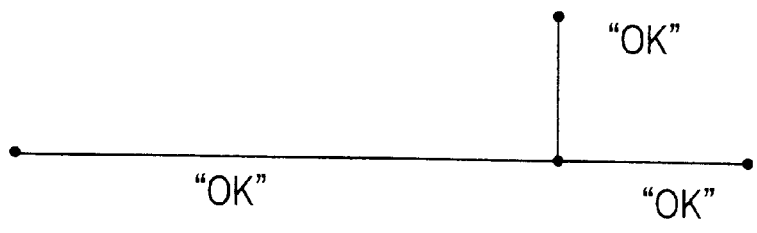

Repeater Insertion for a Two-fanout Net FIG. 5A is a simplified circuit net diagram showing the result of using the new repeater insertion method for a two-fanout net, as contemplated by the present invention. The two-fanout net depicted in FIG. 5A is described by a DSPF file 13. This DSPF file 13 has physical information of the nets. The AXO software 20 generates a Repeater Prohibited Module/Region file 12, a DSPF file 13, an Output Pin Capacitance file 14 and a Rectangular Layout Area file 15, each of which is read 201 by the Repeater Location Calculator 10 with the exception of the DSPF file 13, but in addition to the Parameter file 16 and the Don't Touch Net list file 17. The Repeater Location Calculator 10 then operates upon these files.

Thus, referring to FIG. 14, the first step is to determine 202 whether a net exists in the DSPF 13. As indicated in FIG. 5A, one such net exists (indicated by reference numbers 3 and 4). Returning to FIG. 14, one net is read 203 from the DSPF 13 and a determination of repeater cell 101 need is performed (in this Example the query 213 result of whether the load exceeds the threshold is YES, thus, repeater cells 101 are required).

Because repeater cells 101 are required, the next step is to determine 206 the directed graph of the net (i.e. the driver 11 to the load 6 (not shown)).

The next step is for the repeater cell 101 to be inserted 226 into the net. Driver 11 drives 188LU (100LU+40LU+4LU+40LU+4LU). This capacitance exceeds the threshold value, thus repeater cell location is required within the segment. Since the "InsertOK" flag is set to "OK" at node 2 (referring to FIG. 5B), a repeater cell 101 is inserted into that segment, i.e. between driver 11 and node 2. No more nets exist in the DSPF 13 therefore the operation ends.

The Verilog-HDL Netlist Change file 19, output by the Repeater Location Calculator 10, is compared against the Verilog-HDL Netlist 9 by the Verilog-RDL Netlist Fixer 40 and a Verilog-HDL Netlist with Repeater file 26 is generated.

The Repeater Location Calculator 10 also generates an AXO Repeater Placement file 21 which is then read into the Repeater Relocater 30 together with the Verilog-HDL Netlist Change file 19, the Repeater Prohibited Physical Area information file 23, the Pre-assigned Other Cell information file 24 and the Rectangular Layout Area file 15, to remove overlap and fit to the grid.

The Repeater Relocater 30 then generates an updated AXO Repeater Placement file 25 which together with the Verilog-HDL Netlist with Repeater file 26 Is read by the AXO 20 in order to design a proper software layout with repeater cells.

EXAMPLE 2

Figure 6A:
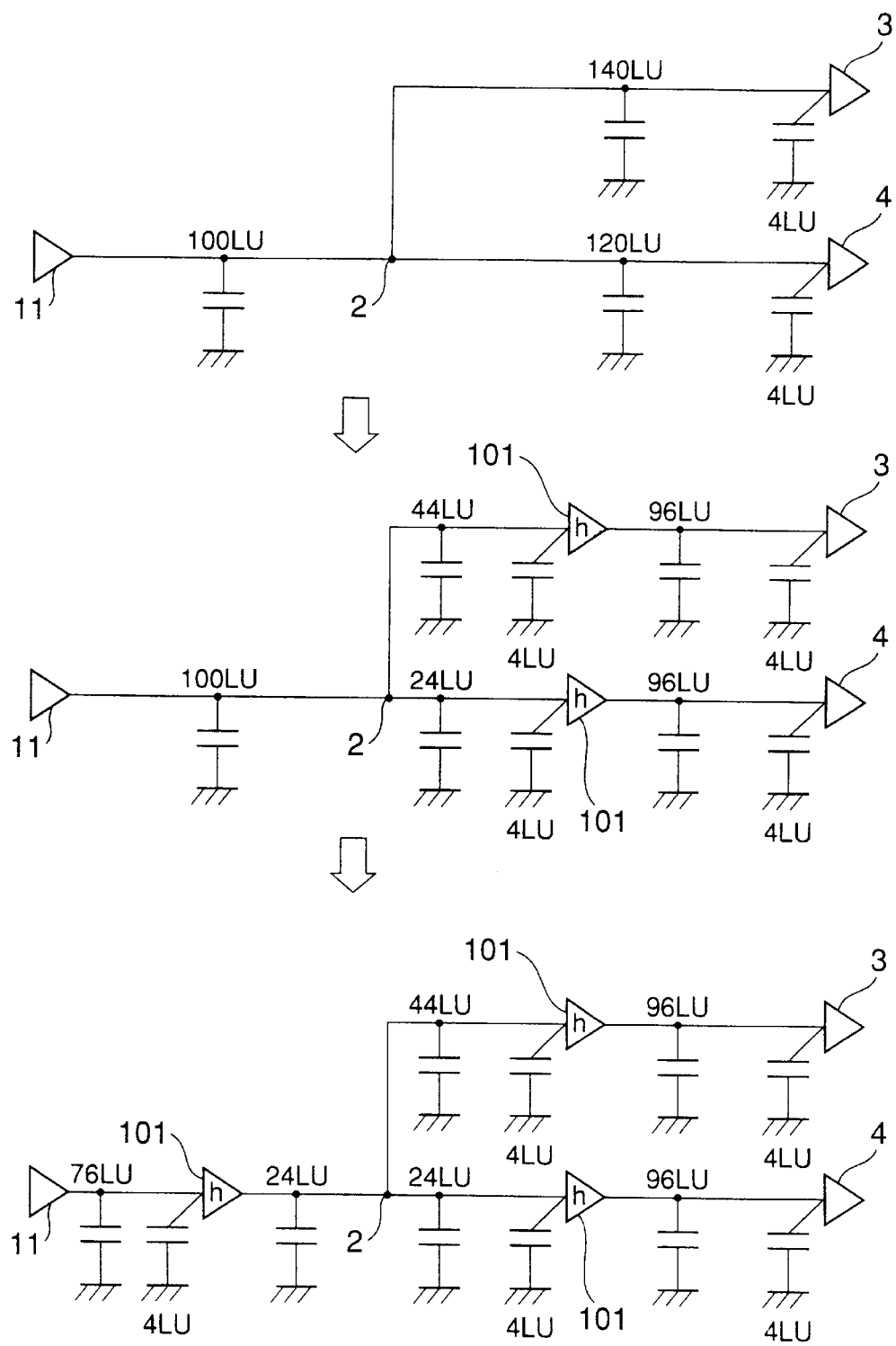
FIG. 6A is a simplified circuit net diagram showing the result of using the new repeater insertion method for a two-fanout net with dissimilar loads.

Repeater Insertion for a Two-fanout Net FIG. 6A is a simplified circuit net diagram showing the result of using the new repeater insertion method for a two-fanout net with dissimilar loads.

The two-fanout net depicted in FIG. 6A is described by a DSPF file 13. This DSPF file 13 has physical information of the nets. The AXO 20 software generates a Repeater Prohibited Module/Region file 12, a DSPP file 13, an Output Pin Capacitance file 14 and a Rectangular Layout Area file 15, each of which is read 201 by the Repeater Location Calculator 10 with the exception of the DSPF file 13, but in addition to the Parameter file 16 and the Don't Touch Net list file 17. The Repeater Location Calculator 10 then operates upon these files.

Figure 6B:
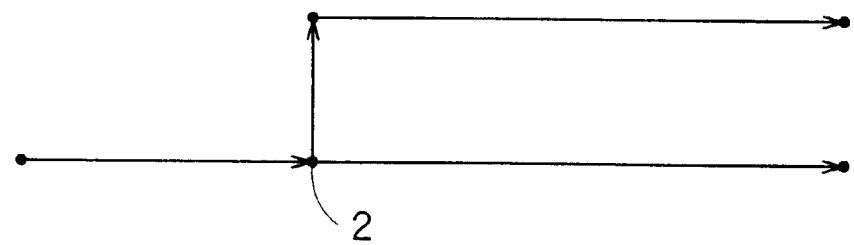
FIG. 6B is a representation of the result of the two-fanout net of FIG. 6A after the Set "InsertOK" Flag Below Node and Count Driving Points Below Node operation has been performed.
Figure 6B:
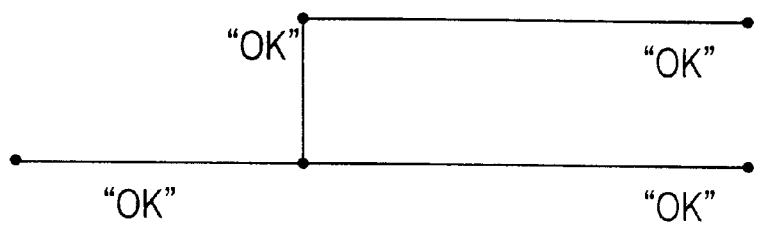

Thus, referring to FIG. 14, the first step is to determine 202 whether a net exists In the DSPF 13. As indicated in FIG. 6A, one such net exists. Returning, then, to FIG. 14, one net is read 203 from the DSPF 13 and a determination of repeater cell 101 need is performed (in this Example the query 213 result of whether the load exceeds the threshold is YES, thus, repeater cells 101 are required). Because repeater cells 101 are required, the next step is to determine 206 the directed graph of the net (i.e. the driver 11 to the load 6 (not shown)). FIG. 6B shows the "InsertOK" flag settings for each of the segments of the net.

The next step is for the repeater cells 101 to be inserted 226 into the net. In this Example, the two fanout net below node 2 has different loads (one is 144LU, the other is 124LU). Driver 11 drives 368LU (100LU+140LU+4LU+120LU+4LU). This capacitance exceeds the threshold value, 100LU. thus repeater cell 101 location is required within the segment.

In this Example, capacitance between nodes 2 and 3 is 144LU (140LU+4LU) and capacitance between nodes 2 and 4 is 124LU (120LU+4LU). Thus, because interval capacitance exceeds the threshold value in each of these segments, repeater cells 101 are required in each of these segments.

After insertion of the initial repeater cells 101 (shown in the middle representation of FIG. 6A), driver 11 still drives a 176LU load (100LU+24LU+4LU+44LU+4LU). Because this load exceeds the threshold capacitance, repeater cell 101 insertion is still required. A repeater cell 101 is inserted into the segment between driver 11 and node 2. No more nets exist in the DSPF 13 therefore the operation ends.

The Verilog-HDL Netlist Change file 19, output by the Repeater Location Calculator 10, is compared against the Verilog-HDL Netlist 9 by the Verilog-HDL Netlist Fixer 40 and a Verilog-HDL Netlist with Repeater file 26 is generated.

The Repeater Location Calculator 10 also generates 210 an AXO Repeater Placement file 21 which is then read into the Repeater Relocater 30 together with the Verilog-HDL Netlist Change file 19, the Repeater Prohibited Physical Area information file 23, the Pre-assigned Other Cell information file 24 and the Rectangular Layout Area file 15, to remove overlap and fit to the grid.

The Repeater Relocater 30 then generates an updated AXO Repeater Placement file 25 which together with the Verilog-HDL Netlist with Repeater file 26 is read by the AXO 20 in order to design a proper software layout with repeater cells.

EXAMPLE 3

Figure 7A:
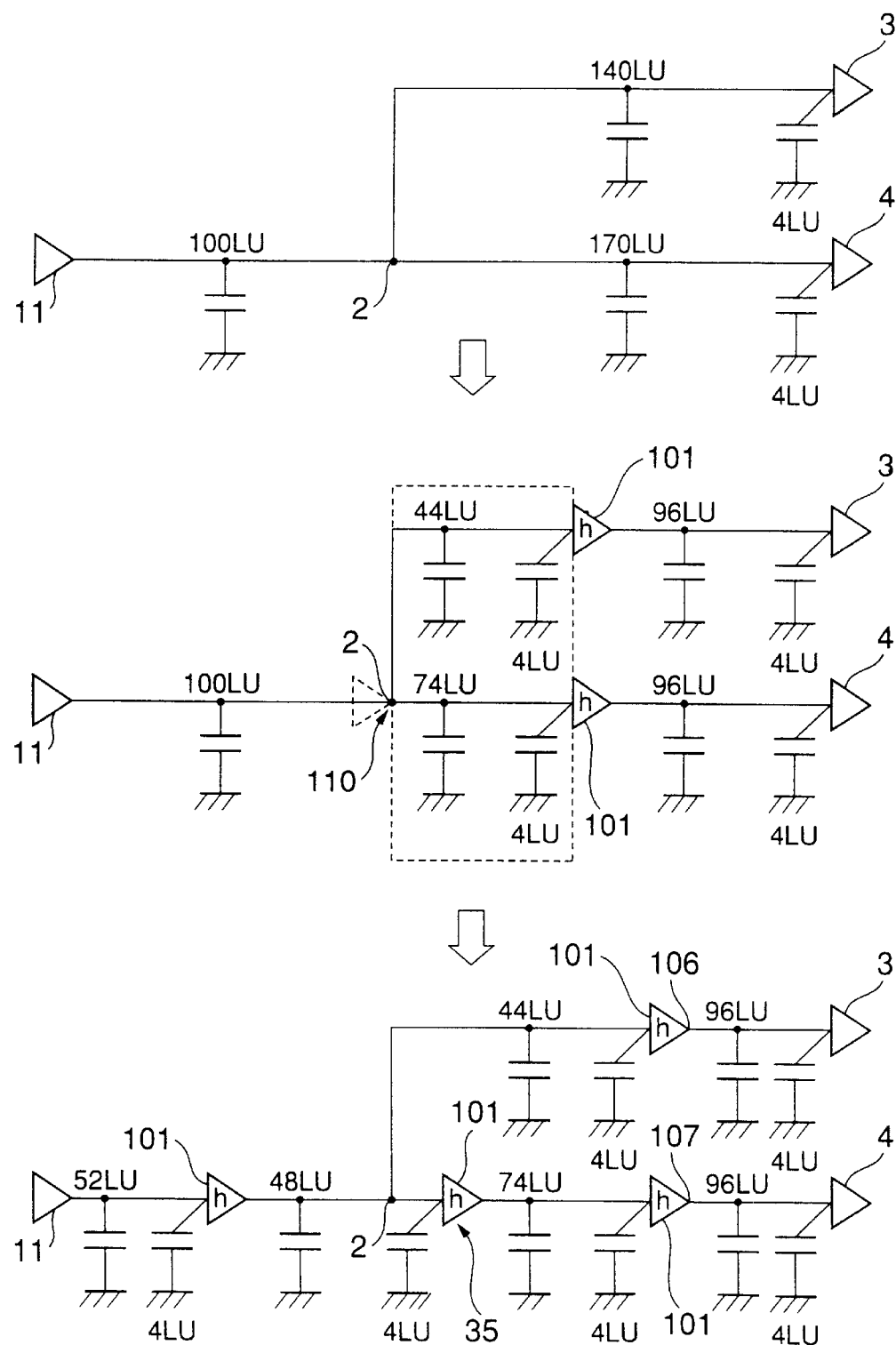
FIG. 7A is a simplified circuit net diagram showing the result of using the new repeater insertion method for a two-fanout net with a branch-cut.

Repeater Insertion for a Two-fanout Net with a Branch Cut FIG. 7A is a simplified circuit net diagram showing the result of using the new repeater insertion method for a two-fanout net with a branch-cut.

The two-fanout net depicted in FIG. 7A is described by a DSPF file 13. This DSPF file 13 has physical information of the nets. The AXO 20 software generates a Repeater Prohibited Module/Region file 12, a DSPF file 13, an Output Pin Capacitance file 14 and a Rectangular Layout Area file 15, each of which is read 201 by the Repeater Location Calculator 10 with the exception of the DSPF file 13, but in addition to the Parameter file 16 and the Don't Touch Net list file 17. The Repeater Location Calculator 10 then operates upon these files.

Thus, referring to FIG. 14, the first step is to determine 202 whether a net exists in the DSPF 13. As indicated in FIG. 7A, one such net exists (referred to by reference numbers 3 and 4). Returning to FIG. 14, one net is read from the DSPF 13 and a determination of repeater cell 101 need is performed (in this Example the query 213 result of whether the load exceeds the threshold is YES, thus, repeaters are required).

Because repeater cells 101 are required, the next step is to determine 206 the directed graph of the net (i.e. the driver 11 to the load (not shown)). Then, the "InsertOK" flag must be set 220 for each of the nodes in the net. Referring to FIG. 7B, the "InsertOK" flags at nodes 3 and 4 (the segment between nodes 2 and 3 and nodes 2 and 4) are set to "OK". Note that the "insertOK" flag does not change during the repeater insertion operation. That is, once the "InsertOK" flag is set to "OK", it will not change to "notOK", and once the "InsertOK" flag is set to "notOK", it will not change to "OK" during the repeater insertion operation.

The next step is for the repeater cells 101 to be inserted 226 into the net. In this Example, the two fanout nets have different loads. Driver 11 drives 418LU (100LU+140LU+4LU+170LU+4LU). This capacitance exceeds the threshold value, 100LU, thus repeater cell 101 location is required within the segment.

In this Example, capacitance between nodes 2 and 3 is 144LU (140LU+4LU) and capacitance between nodes 2 and 4 is 174LU (170LU+4LU). Thus, because interval capacitance exceeds the threshold value in each of these segments, repeater cells 101 are required in each of these segments After insertion of the initial repeater cells 101 (illustrated by the middle drawing in FIG. 7A), driver 11 still must drive a 226LU load (100LU+44LU 4LU+74LU+4LU). Because this load exceeds the threshold capacitance, repeater cell 101 insertion is still required. In this Example, the load at node 2 is too heavy (represented by dotted line representation 110); it exceeds the threshold capacitance for one repeater cell 101.

As contemplated by the invention, in order to maintain desired interval capacitance throughout the net, a repeater cell 101 is inserted 232 into the heaviest-load net, represented by location 35 (in this Example the net between nodes 2 and 107).

Now, driver 11 has a load of only 152LU (100LU+44LU+4LU+4LU). A repeater cell 101 is inserted into that segment, between driver 11 and node 2. No more nets exist in the DSPF 13 therefore the operation ends.

The Verilog-HDL Netlist Change file 19, output by the Repeater Location Calculator 10, is compared against the Verilog-HDL Netlist 9 by the Verilog-HDL Netlist Fixer 40 and a Verilog-HDL Netlist with Repeater file 26 is generated. The Repeater Location Calculator 10 also generates 210 an AXO Repeater Placement file 21 which is then read into the Repeater Relocater 30 together with the Verilog-HDL Netlist Change file 19, the Repeater Prohibited Physical Area information file 23, the Pre-assigned Other Cell information file 24 and the Rectangular Layout Area file 15, to remove overlap and fit to the grid.

The Repeater Relocater 30 then generates an updated AXO Repeater Placement file 25 which together with the Verilog-HDL Netlist with Repeater file 26 is read by the AXO 20 in order to design a proper software layout with repeater cells.

EXAMPLE 4

Repeater Insertion for a Three-fanout Net with a Branch Cut

FIG. 8A is a simplified circuit net diagram showing the result of using the new repeater insertion method for a three-fanout net with a branch out.

The three-fanout net depicted in FIG. 8A is described by a DSPF file 13. This DSPF file 13 has physical information about the nets. The AXO 20 software generates a Repeater Prohibited Module/Region file 12, a DSPF file 13, an Output Pin Capacitance file 14 and a Rectangular Layout Area file 15, each of which is read 201 by the Repeater Location Calculator 10 with the exception of the DSPF file 13, but in addition to the Parameter file 16 and the Don't Touch Net list file 17. The Repeater Location Calculator 10 then operates upon these files.

Thus, referring to FIG. 14, the first step is to determine 202 whether a net exists in the DSPF 13. As indicated in FIG. 8A, one such net exists (represented by reference numbers 3, 4, and 5).

Returning to FIG. 14, one net is read 203 from the DSPF 13 and a determination of repeater cell 101 need is performed (in this Example the query 213 result of 16 whether the load exceeds the threshold is YES, thus, repeaters are required).

Because repeaters are required, the next step is to determine 206 the directed graph of the net (i.e. the driver 11 to the load (not shown)). Then, the "InsertOK" flag must be set 220 for each of the nodes in the net.

Referring to FIG. 8B, the "InsertOK" flag settings at each of the node segments are shown. However, the load at node 2 is too heavy, i.e. exceeds the threshold capacitance for one repeater, therefore a repeater cannot be simply inserted at this point.

But repeater cells 101 are still required to be inserted into the net, In this Example, the three fanout net has different loads. Driver 11 drives 292LU (100LU+70LU+4LU+60LU+4LU+50LU+4LU). This capacitance exceeds the threshold value, 100LU, thus repeater cell 101 location is required within the segment.

As contemplated by this invention, in order to maintain desired interval capacitance throughout the net, a repeater cell 101 is inserted 232 into the heaviest-load net (in this Example the net between nodes 2 and 3), at a location represented by reference number However, driver 1 still has a load of 222LU (100LU+60LU+4LU 4–50LU+4LU+4LU). This exceeds threshold capacitance, therefore repeater cell 101 insertion is still required. The load at node 2 is still too heavy for one repeater. Still a repeater cell 101 cannot be simply inserted at this point.

But, repeater cells 101 are still required to be inserted into the net. As contemplated by this invention, in order to maintain desired interval capacitance throughout the net, a repeater cell 101 is inserted 232 into the next heaviest-load net (in this Example the net between nodes 2 and 4), at a location represented by reference number 55. Now, driver 11 has a load of only 162LU (100LU+50LU+4LU+4LU+4LU). This time, a repeater cell 101 is inserted into the segment, i.e. between driver 11 and node 2. No more nets exist in the DSPF 13 therefore the operation ends.

The Verilog-HDL Netlist Change file 19, output by the Repeater Location Calculator 10, is compared against the Verilog-HDL Netlist 9 by the Verilog-HDL Netlist Fixer 40 and a Ver log-HDL Netlist with Repeater file 26 is generated.

The Repeater Location Calculator 10 also generates 210 an AXO Repeater Placement file 21 which is then read into the Repeater Relocater 30 together with the Verilog-HDL Netlist Change file 19, the Repeater Prohibited Physical Area information file 23, the Pre-assigned Other Cell information file 24 and the Rectangular Layout Area file 15, to remove overlap and fit to the grid.

The Repeater Relocater 30 then generates an updated AXO Repeater Placement file 25 which together with the Verilog-HDL Netlist with Repeater file 26 is read by the AXO 20 in order to design a proper software layout with repeater cells.

EXAMPLE 5

Repeater Insertion Method Considering the Back-annotation to Synthesis "Back-annotation" refers to the method of writing the result of the repeater cell insertion to the software Layout tool, i.e. the AXO 20.

Figure 9A:
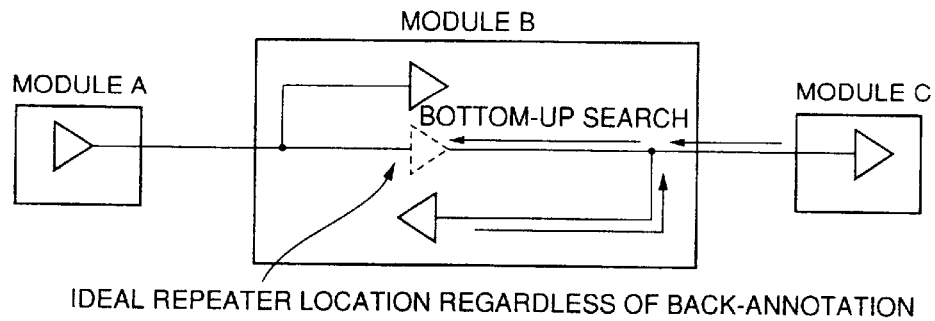
FIG. 9A is an illustration representing ideal repeater cell insertion location as a result of using the new repeater insertion method.
Figure 9B:
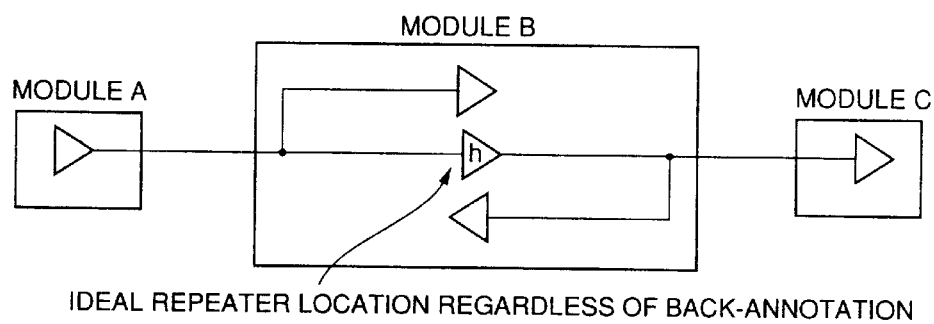
FIG. 9B is an illustration representing the result of using the new repeater insertion method regardless of "back-annotation".
Figure 9C:
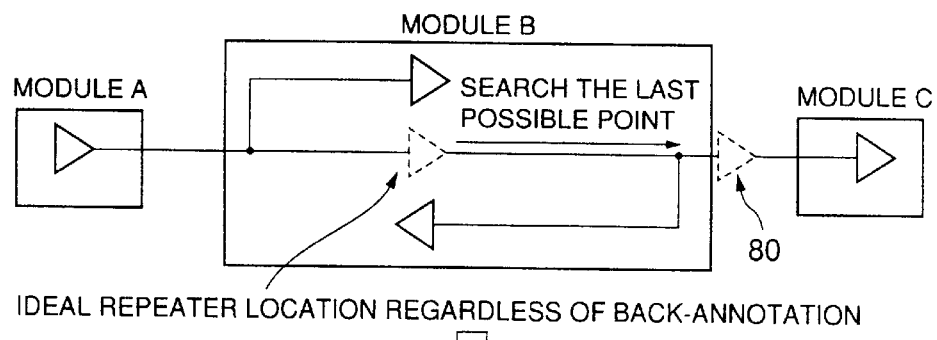
FIG. 9C is an illustration representing the result of using the new repeater insertion method considering "back-annotation".
Figure 9C:
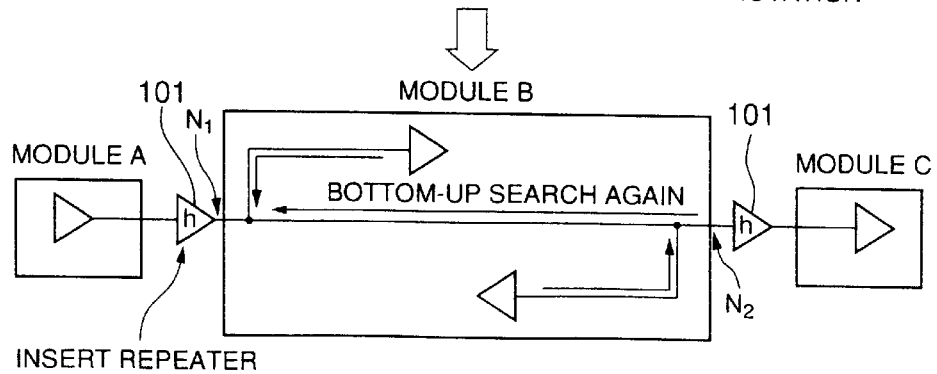

Referring now to FIGS. 9A, 9B, and 9C, each circuit module is characterized by a certain software module netlist. The following chart represents a typical software netlist for a three module (module A, module B, and module C) net represented by FIGS. 9A, 9B, and 9C.

| netlist before repeater insertion (FIG. 9A) | |
|---|---|
| module A (out); | module top(); |
| output out; | wire bus; |
| endmodule | ... |
| module B (in); | A A (.out(bus)); |
| input in; | B B (.in(bus)); |
| endmodule | C C (.in(bus))/ |
| module C (in); | ... |
| input in; | endmodule |
| endmodule | |

Generally, the ideal location for a repeater cell 101 insertion point falls inside a module point as illustrated in FIG. 9A. Insertion of a repeater cell 101 at such point results in an additional input/output parameter for that module, which cannot be adequately represented in the netlist, i.e. the repeater cannot be "back-annotated" into the software. The following chart represents the netllst after repeater cell 101 placement at the ideal location regardless of "back-annotation" as depicted in FIGS. 9A and 9B.

| netlist after BAD repeater insertion (FIG. 9B) | |
|---|---|
| module A (out); | module top() |
| output out; | wire bus; |
| ... | wire new bus; |
| endmodule | ... |
| | A A (.out(bus)); |
| module B (in, new out) bus)): | B B (.in(bus), .new out(new |
| input in; | C C (.in (new busTT -- -- | netlist after BAD repeater insertion (FIG. 9B)

outnut new put:        . . .
. . .                  endmodule
buf buf0(in, new_out);
. . .
endmodule
module C (in);
input in;
. . .
endmodule However, in the present invention, although ideal repeater cell 101 location lies within the module (illustrated in FIG. 9A) placement occurs just outside the module (as illustrated in FIG. 9C). As a result, the following chart represents the netlist considering the "back-annotation". As is shown, no additional input/output parameters are required for the module in the netlist.

netlist after CORRECT repeater insertion (FIG. 9C)

| module A (out); | module top(); |
|---|---|
| output out; | wire bus |
| . . . | wire bus1, bus2; |
| endmodule | . . . |
| | A A (.out(bus)); |
| module B (in); | buf buf0(bus,bus1); |
| input in; | B B (.in(bus1)); |
| . . . | buf buf1(bus1, bus2); |
| endmodule | . . . |
| | C C (.in(bus2)); |
| module C (in); | . . . |
| input in; | endmodule |
| . . . | |
| endmodule | |

Thus, the module remains adequately represented by the netllst and the repeater cell 101 is successfully "back-annotated" into the software.

The following chart with reference to FIG. 20, illustrates the successful "back-annotatlon" technique contemplated by this invention.

|  | Point: Driver, Load Node: Intersection, Point Module \| # of Points | |
|---|---|---|
|  | A       1 | |
|  | B       2 | |
|  | C       1 | |
| Node | Driving Points | InsertOK? |
| LI | Bx1 | notOK |
| L2 | Bx1 | notOK |
| L3 | Cx1 | OK |
| N1 | Bx2, Cx1 | OK |
| N2 | Bx1, Cx1 | notOK |

If the driving points of a node are 0 for each module, the segment just above the node has "insertOK"=OK.

As shown in FIG. 9C, ideal repeater cell 101 location lies within Module B. However, Module B has two points, N1 and N2. The respective driving points for node N1 are Bx2 and Cx1 (that is, there are two points in Module B, and 1 point in Module C), whereas the driving points for node N2 are Bx1 and Cx1 (that is, there is one point in Module B and one point in Module C). That is, the driving points for node N1 have two points in module B and one point in module C, and the driving points for node N2 has one point in module B and one point in module C. Further, the "InsertOK" flag settings, in the above chart, indicate which segments are available to repeater cell 101 insertion.

Although ideal insertion lies between nodes N1 and N2, because no repeater cell 101 can be inserted within a module, the repeater cell 101 is "forced" inserted in the last possible point, i.e. the segment just below (following) the module.

Therefore, although ideal repeater cell 101 location is between nodes N1 and N2, the cell 101 is "forced" inserted between nodes N2 and L3, i.e. the last possible point, represented by reference number 80 in FIG. 9C. Thus, referring to FIGS. 9A, 9B, and 9C and the depicted charts herein, the repeater cell 101 can be inserted while the netlist indicates the insertion without the need for additional input/output pins to the module definition.

EXAMPLE 6

Figure 10:
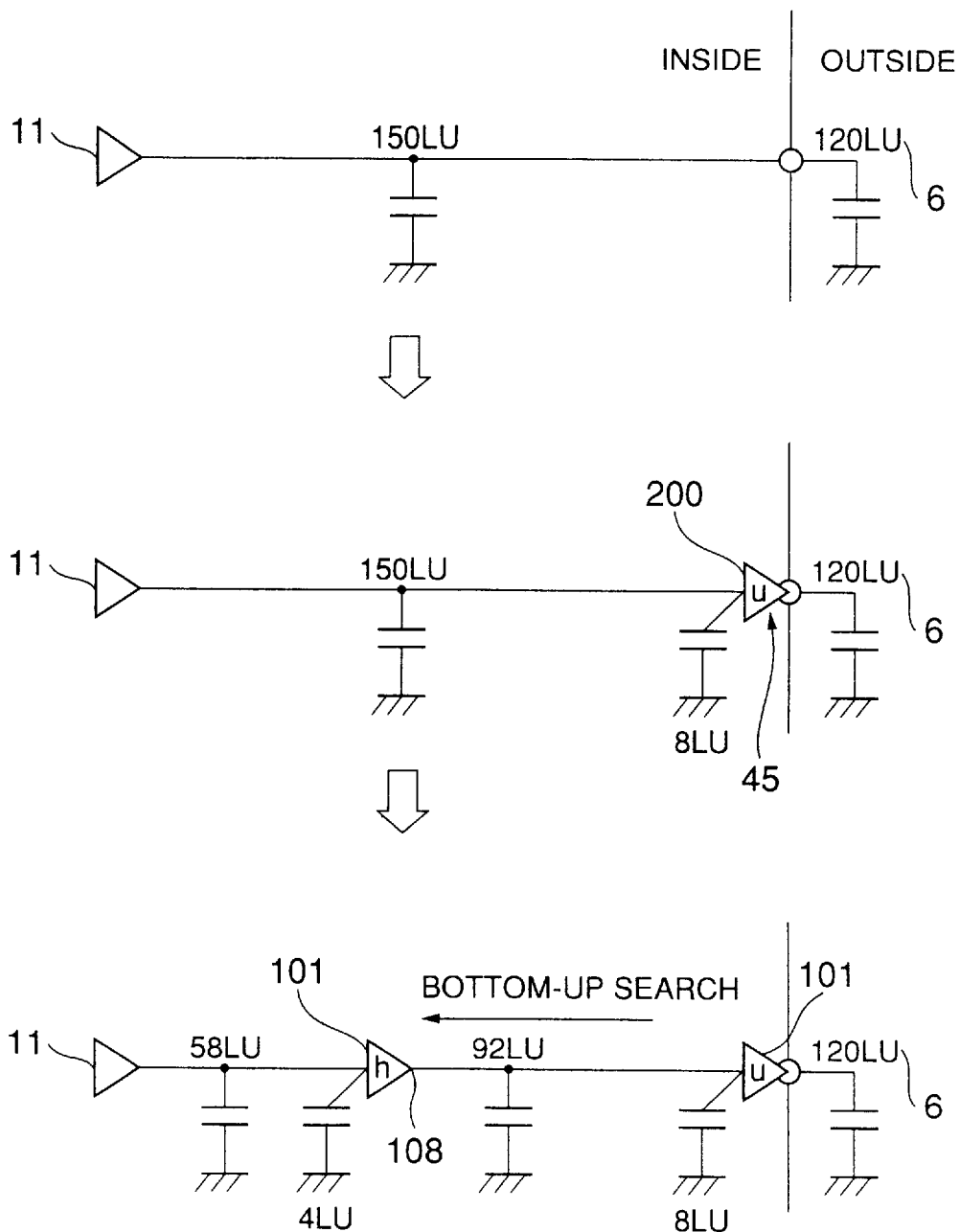
FIG. 10 is a simplified circuit net diagram showing the result of the new repeater insertion method using two different sizes of repeaters for one primary-output net with a large load.

Repeater Insertion Method Using Two Sizes of Repeater Cells Referring now to FIG. 10. FIG. 10 is a simplified circuit net diagram showing the result of the new repeater insertion method using two different sizes of repeaters for one primary-output net with a large load. A "U-buffer" repeater cell 200 is employed to drive the excess load 6. This larger buffer 200 aids in minimizing the signal delay that was inherent under the old method.

Again, referring to FIG. 10, the method of repeater insertion is identical to the above described method. That is, the net depicted in FIG. 10 is described by an AXO 20 software layout file. The AXO 20 software generates a Repeater Prohibited Module/Region file 12, a DSPF file 13, an Output Pin Capacitance fIle 14 and a Rectangular Layout Area file 15, each of which is read 201 by the Repeater Location Calculator 10 with the exception of the DSPF file 13, but in addition to the Parameter file 16 and the Don't Touch Net list file 17. The Repeater Location Calculator 10 then operates upon these files.

Thus, referring to FIG. 14, the first step is to determine 202 whether a net exists in the DSPF 13. As indicated in FIG. 10, one such net exists. Returning to FIG. 15, one net is read 203 from the DSPF 13 and a determination of repeater cell 200 need is performed (in this Example the query 213 result of whether the load exceeds the threshold is YES, thus, repeaters are required).

A repeater cell 200 is located at the extremely large load 6, represented by reference number 45. However, interval capacitance between driver 11 and repeater cell 200 exceeds threshold capacitance. Thus, repeater cell 101 location is required within the segment.

The "InsertOK" flag is set to "OK" in the segment between nodes 11 and 45. Therefore, a repeater cell 101 is inserted into that segment, i.e. between driver 11 and node 45. No more nets exist in the DSPF 13 therefore the operation ends.

The Verilog-HDL Netlist Change file 19, output by the Repeater Location Calculator 10, is compared against the Verilog-HDL Netlist 9 by the Verilog-HDL Netlist Fixer 40 and a Verilog-HDL Netlist with Repeater file 26 is generated.

The Repeater Location Calculator 10 also generates 210 an AXO Repeater Placement file 21 which is then read into the Repeater Relocater 30 together with the Verilog-HDL Netlist Change file 19, the Repeater Prohibited Physical Area information file 23, the Pre-assigned other Cell information file 24 and the Rectangular Layout Area file 15, to remove overlap and fit to the grid.

The Repeater Relocater 30 then generates an updated AXO Repeater Placement file 25 which together with the Verilog-HDL Netlist with Repeater file 26 is read by the AXO 20 in order to design a proper software layout with repeater cells.

Therefore, using various size buffers as repeater cells, i.e. an "H-buffer" repeater cell and a "U-buffer" repeater cell, in the phase of repeater insertion allows for easier and simplified calculation methods of repeater cell 101 location and size. Furthermore, it is desirable to include various repeater cell 101, 200 sizes in current VLSI design trends.

Additionally, "back-annotation" by the method contemplated in this invention, is equally successful when applied to various sized repeater cells 101, 200.

Figure 11:
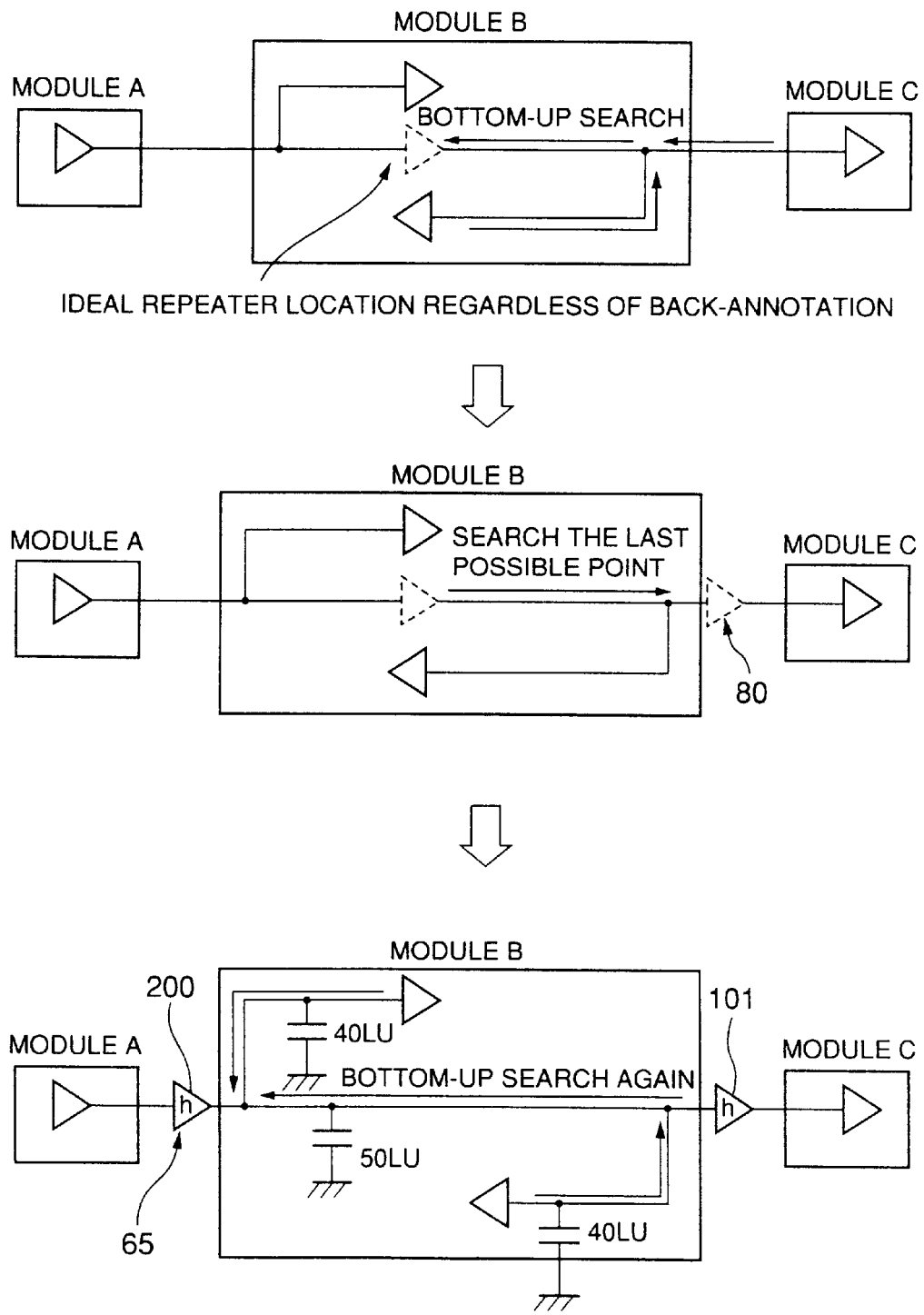
FIG. 11 is an illustration representing the result of using the new repeater insertion method using two different sizes of repeaters considering "back-annotation".

For example, FIG. 11 shows a block diagram of "U-bufferf" insertion. Ideally, repeater cell position falls within module B; however, no repeater cell 101 can be allowed inside module B in order to maintain successful "back-annotation" into layout or synthesis software, as described in above Example 5. Furthermore, the load inside module B and below exceeds 100LU. Because no repeater cell 101 can be positioned within the module, the repeater cell 101 is "forced" inserted in the last possible point 80 i.e. to just outside the module. But, referring to FIG. 11, the load inside of module B exceeds 100LU. To compensate, a "U-buffer" repeater is placed before module B 65 in order to drive the excessive loads within the module, while minimizing delay.

EXAMPLE 7

Repeater Insertion Method Considering the Slack of Each Fanout

In many instances, the slack of each fanout varies such that certain fanout branches are more critical than others. This invention considers the slack of each fanout and makes the signal delay from the source to the most critical fanout shorter than the result of usual repeater insertion.

For example, referring to FIG. 12, the slack of each of the fanout is indicated. As illustrated, one fanout is "more critical" than the other (LOAD A), i.e. a higher operation priority, it is desirable to ensure that the more critical fanout is carried out without. increasing signal delay due to slack from the less-critical fanout.

The repeater insertion method described always compares 229 the slack value of each branch at every crossing point of branches, e.g. node 2. The less-critical branch load is always cut-off 230 from the more-critical branch load.

The method contemplated in order to produce such a result is described as follows with reference made from the (Fanouts Different Slack?) query 229 of FIG. 22. Initially, the slack values of each of the fanouts at crossing-node 2 are compared 229. Once determined which branch is the more critical branch, in order to ensure that branch execution is not delayed by slack from less critical branches, a repeater cell 101 is inserted 230 within the less critical branch, at reference point 90 in FIG. 12C.

Once the less-critical branch is eliminated, if interval capacitance exceeds threshold capacitance, repeater cell 101 insertion is carried out as described in the above Examples.

In this Example, after considering 229 the slack, and cutting-off 230 the less critical load, point 90, driver 11 has a load of only 138LU (80LU+50LU+4LU+4LU). A repeater cell 101 is inserted into the segment, i.e. between driver 11 and node 2.

The above described technique results in simple-timing-driven repeater results. Since it is not the complete timing-driven repeater insertion of the prior art, there is no need for a timing analyzer. Faster processing speeds are maintained while eliminating the need to complete timing information like SDF (Standard Delay Format).

As previously discussed, the present invention can be practiced by a software program executing with conventional place-and-route software tool operating on Unix or any other comparable operating system. Together, the software program and the operating system can be executed on a computer system 300 such as that shown in FIG. 29.

The computer system 400 comprises a processor 410, a memory 420, a permanent storage such as a hard disk drive or a CD-ROM 430. The result of the operation by the processor 410 can be displayed on a monitor 440. The software on the storage device 430 is read into memory 420 where it is executed by the processor 410. The result can be displayed on the monitor 440.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

(Second Embodiment)

The above-mentioned first embodiment a repeater cell without taking a delay time of the repeater cell itself into consideration. Therefore, there is a likelihood that a number of the repeater cell are inserted to interconnection paths that cannot afford the time, and that a timing limitation of the circuit cannot be assured.

For example, FIG. 30 is a diagram showing an example that the timing limitation from the output terminal of the driver 11 to a load A is 3 ns, that the timing limitation to a load B is 4 ns, and that the timing limitation to a load C is 6 ns.

The above-mentioned first embodiment compares the timing limitation of each branch path with each other, without taking a delay of the repeater cell itself into consideration, and inserts the repeater cell to the branch path that can afford the time.

In the case of FIG. 30, the timing limitation from the output terminal of the driver 11 to the load B, which is 4 ns, is more severe than that to the load C. Therefore, a first repeater cell is inserted on the path to the load C, because the timing limitation of the load B is more severe than that of the load C.

Next, because a capacitance of a path between a branch point for the load B, C and the driver 11 is greater than the threshold capacitance, a second repeater cell is inserted to the path.

Next, the timing limitation 4 ns to the load B, which is more severe than that to the load C is compared with the timing limitation 3 ns to the load A. On the basis of the compared result, a third repeater cell is inserted on the path to the load B, because the timing limitation of the load A is more severe than that of the load B.

However, if the location to insert the repeater cell is decided on the basis of only the timing limitation of each path as shown in FIG. 30, there is a likelihood that it is impossible to abide by the timing limitation for the loads B and C by the delay of the repeater cell itself.

FIG. 31A and FIG. 31B are diagrams for explaining a method to insert the repeater cell according to the second embodiment. In the second embodiment, the timing limitation to the load B, which is 4 ns, is compared with that to the load C, which is 6 ns. On the basis of the compared result, the first repeater cell is inserted on the path to the load C, because the timing limitation to the load C is less severe than that to the load B. The above-mentioned procedure is almost the same as FIG. 30.

Next, taking a delay of the first and second repeater cells themselves into consideration, the timing limitations from the output terminal of the driver 11 to the loads B and C are updated. That is, the timing limitations to the loads B and C is set more severely by taking the delay of the repeater cells themselves into consideration.

More specifically, the timing limitation to the load B is updated to are updated 2 ns (=4 ns–2 ns), and the timing limitation to the load C is updated to 4 ns (=6 ns–2 ns).

At the branch point between the path to the load A and the path to the loads B, C, more severe timing limitation of those to the loads B and C is compared with that to the load A, which is 3 ns. In the case of FIG. 31A, because the timing limitations to the loads B and C are 2 ns, 2 ns is compared with the timing limitations to the load A, which is 3 ns. In this case, because the timing limitation of the former is more severe than that of the latter, a third repeater cell is inserted on the path to the load A.

Thus, the second embodiment determines the location to insert the repeater cell, taking the delay of the repeater cell itself into consideration. Therefore, it is possible to insert the repeater cell to the most appropriate position, taking an overall signal delay into consideration.

What is claimed is:

1. A method for positioning repeater cells, comprising the steps of;
    a) setting circuit paths between an input terminal and an output terminal in a circuit block including at least one of a circuit element, said input terminal, and said output terminal; and
    b) inserting said repeater cells on said circuit paths such that circuit parameters, including at least one of wiring capacitance and wiring resistance, on the set circuit paths become smaller than a corresponding prescribed reference threshold value.

2. The method of claim 1 wherein said inserting step further comprises the steps of:
    1) determining whether or not there is at least one circuit net on said circuit paths into which said repeater cell can be inserted;
    2) calculating said circuit parameters for each circuit net if the existence of said at least one net is determined; and
    3) selecting, from the circuit parameters calculated in step 2), the circuit parameters greater than said predetermined reference threshold level, and inserting said repeater cell into a net corresponding to each of the selected parameters.

3. The method of claim 2 wherein one of said circuit parameters is a load capacitance.

4. The method of claim 2 wherein said steps 1)–3) are carried out based on a plurality of data files.

5. The method of claim 2 wherein said step 3) further includes the steps of searching a position for inserting said repeater cell in a direction from a side of said output to a side of said input, and inserting said repeater cell so that said circuit parameters for each of the nets that constitute said circuit path are less than said corresponding reference threshold level.

6. The method of claim 2 wherein said step 3) includes the step of:

4) setting a prohibited location for prohibiting arrangement of said repeater cells,
    wherein among the circuit nets corresponding to said selected circuit parameters, the circuit nets having said circuit net larger than said reference threshold value, said repeater cell is not inserted on the circuit net crossed with the prohibited location in a selected circuit net, and said repeater cell is inserted on the circuit net not crossed with said prohibited location.

7. The method of claim 6 wherein in said step 4), said prohibited location is set between a selected node on said circuit paths and said output except that said selected node drives all nodes placed lower than said selected node or that said selected node drives none of other nodes.

8. The method of claim 2 further comprising the steps of:
    5) setting a timing limitation for each of the circuit nets; and
    6) updating the timing limitation for each of the circuit nets, into which said repeater cell is inserted, taking into consideration the delay of said repeater cell itself, when said repeater cell is inserted in said step 3).

9. The method of claim 2 where in said step 3), a repeater cell to be inserted is selected from a plurality of types of repeater cells each of which has different driving ability.

10. The method of claim 2 further comprising the step of:
    7) generating a netlist by back-annotating the result of the insertion of said repeater cell carried out in said step 3).

11. The method of claim 2 wherein in said step 3), when each of the circuit nets has a different signal delay time, said repeater cell is inserted into the circuit nets except for a circuit net that is not most critical.

12. The method of claim 1,
    wherein at least one circuit module is connected between said input terminal and said output terminal, and
    said repeater cells are inserted on said circuit paths except for the inside of said at least one circuit module.

13. The method of claim 11,
    wherein when said repeater cells are inserted, the circuit parameters of the circuit paths connected to input and output terminals of said circuit modules are treated as the circuit parameters of said input and output terminals.

14. An apparatus for positioning repeater cells, comprising:
    circuit path setting means configured to set circuit paths between an input terminal and an output terminal in a circuit block including at least one of a circuit element, said input terminal, and said output terminal;
    judging means configured to judge whether or not at least one of circuit nets capable of inserting said repeater cells exists on said circuit paths;
    circuit parameter calculating means for calculating circuit parameters, including at least one of capacitance and wiring resistance, for each of the circuit nets; and
    repeater cell inserting means for selecting said circuit parameters larger than a corresponding reference threshold value and inserting said repeater cells on the circuit nets corresponding to the selected circuit parameters.

15. The apparatus of claim 14 wherein one of said circuit parameters is a load capacitance.

16. The apparatus of claim 14 wherein said circuit path setting means, said judging means, said circuit parameter calculating means, and said repeater cell inserting means are carried out based on a plurality of data files.

17. The apparatus of claim 14 wherein said repeater cell inserting means inserts said repeater cell in a direction from a side of said output to a side of said input, and inserts said repeater cell so that said circuit parameters for each of the nets that constitute said circuit path are less than said reference threshold level.

18. The apparatus of claim 14 further comprising.

inhibited area setting means for setting, on said circuit paths between said input and said output a prohibited location in which positioning of said repeater cell is prohibited, wherein said repeater cell inserting means selects a circuit net having a parameter greater than said reference threshold level, and inserts said repeater cell into the selected net.

19. The apparatus of claim 18 wherein said inhibited area setting means set between a selected node on said circuit paths and said output except that said selected node drives all nodes placed lower than said selected node or that said selected node drives none of other nodes.

20. The apparatus of claim 14 further comprising:

timing limitation setting means for setting a timing limitation for each of the circuit nets; and timing limitation for updating means for updating the timing limitation for each of the circuit nets, into which said repeater cell is inserted, taking into consideration the delay of said repeater cell itself, when said repeater cell is inserted by said repeater cell inserting means.

21. The apparatus of claim 14 wherein said repeater cell inserting means select a repeater cell to be inserted from a plurality of types of repeater cells, each type having different driving ability.

22. The apparatus of claim 14 further comprising: netlist generating means for generating a netlist by back-annotating the result of the insertion of said repeater cell carried out in said repeater cell inserting means.

23. The apparatus of claim 14 wherein said repeater cell inserting means inserts said repeater cell into the circuits nets except for a circuit net that is most critical, when each of the circuit nets has different signal delay time, said repeater cell is inserted.

24. The apparatus of claim 14, further comprising:

at least one circuit module is connected between said input terminal and said output terminal, wherein said repeater cells are inserted on said circuit paths except for the inside of said at least one circuit module.

25. The apparatus of claim 24, wherein circuit parameter calculating means calculate the circuit parameters of the circuit paths connected to the input and output terminals of said circuit module by including the circuit parameters of said input and output terminals.

26. A computer program embodied on computer-readable medium for positioning a repeater cell, said program comprising the steps of:

1) setting circuit paths between an input terminal and an output terminal in a circuit block including at least one of a circuit element, said input terminal, and said output terminal;

2) judging whether or not at least one of circuit nets capable of inserting said repeater cells exists on said circuit paths;

3) calculating circuit parameters, including at least one of wiring capacitance and writing resistor, for each of the circuit nets when judged that said circuit nets exist;

4) selecting said circuit parameters larger than a corresponding reference threshold value; and 5) inserting said repeater cell on the circuit nets corresponding to the selected circuit parameter.

27. The program of claim 26 wherein one of said circuit parameters is a load capacitance.

28. The program of claim 26 wherein said steps 1)–5) are carried out based on a plurality of data files.

29. The program of claim. 26 wherein said step 5) farther includes the steps of searching a position for inserting said repeater cell in a direction from a side of said output to a side of said input, and inserting said repeater cells so that said circuit parameters for each of the nets that constitute said circuit paths are less than said reference threshold level.

30. The program of claim 26 further comprising the step of:

6) setting, on said circuit paths between said input and said output, a prohibited location in which positioning of said repeater cell is prohibited, wherein in said step 5), a circuit net having a parameter greater than said reference threshold level is selected on said circuit paths except for said prohibited location, and said repeater cell is inserted into the selected net.

31. The program of claim 30 wherein in said step 6), said prohibited location is set between a selected node on said circuit paths and said output except that said selected node drives all the nodes placed lower than said selected node or that said selected node drives none of other nodes.

32. The program of claim 26 further comprising the steps of 6) setting a timing limitation for each of the circuit nets; and 7) updating the timing limitation for each of the circuit acts, into which said repeater cell is inserted, taking into consideration tile delay of said repeater cell itself, when said repeater cell is inserted in said step 5).

33. The program of claim 26 wherein in said step 4), a repeater cell to be inserted is selected from a plurality of types of repeater cells, each type having different driving ability.

34. The program of claim 26 further comprising:

8) generating a netlist by back-annotating the result of the insertion of said repeater cell cared out in said step 5).

35. The program of claim 26 wherein in said step 5), when each of the circuit nets has a different signal delay time, said repeater cell is inserted into the circuit nets except for a circuit net that is most critical.

36. The program of claim 26, wherein at least one circuit module is connected between said input terminal and said output terminal, and said repeater cells are inserted on said circuit paths except for the inside of said at least one circuit module.

37. The program of claim 36, wherein when said repeater cells are inserted, the circuit parameters of the circuit paths connected to input and output terminals of said circuit modules are treated as the circuit parameters of said input and output terminals.

* * * * *